United States Patent
Sutani et al.

(10) Patent No.: US 6,701,512 B2
(45) Date of Patent: Mar. 2, 2004

(54) FOCUS MONITORING METHOD, EXPOSURE APPARATUS, AND EXPOSURE MASK

(75) Inventors: Takumichi Sutani, Yokohama (JP); Tadahito Fujisawa, Tokyo (JP); Takashi Sato, Fujisawa (JP); Takashi Sakamoto, Zushi (JP); Masafumi Asano, Yokohama (JP); Soichi Inoue, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 213 days.

(21) Appl. No.: 10/052,527

(22) Filed: Jan. 23, 2002

(65) Prior Publication Data

US 2002/0100012 A1 Jul. 25, 2002

(30) Foreign Application Priority Data

Jan. 24, 2001 (JP) ........................ 2001-015975
Mar. 27, 2001 (JP) ........................ 2001-090774

(51) Int. Cl.7 .......................... G06F 17/50; G03C 5/00; G01J 1/00
(52) U.S. Cl. .............................. 716/21; 716/19; 430/30; 250/491.1
(58) Field of Search ................. 716/19, 20, 21; 250/492.1, 491.1, 492.22; 430/30

(56) References Cited

U.S. PATENT DOCUMENTS

| | | | |
|---|---|---|---|
| 5,124,927 A | * | 6/1992 | Hopewell et al. ........... 700/121 |
| 5,300,786 A | | 4/1994 | Brunner et al. |
| 5,949,547 A | * | 9/1999 | Tseng et al. ................. 356/614 |
| 5,952,132 A | | 9/1999 | King et al. |
| 6,063,531 A | * | 5/2000 | Singh et al. .................. 430/30 |
| 6,337,217 B1 | * | 1/2002 | Hause et al. ................... 438/7 |

FOREIGN PATENT DOCUMENTS

| | | |
|---|---|---|
| JP | 6-120116 | 4/1994 |
| JP | 10-335208 | 12/1998 |

OTHER PUBLICATIONS

Kyoko Izuha, "Mask and Method for Focus Monitoring", filed Sep. 27, 2000, Ser. No. 09/671,501.
Tadahito Fujusawa et al., "Control Method for Exposure Apparatus and Control Method for Semiconductor Manufacturing Apparatus", filed Sep. 27, 2000, Ser. No. 09/671,502.

* cited by examiner

Primary Examiner—Leigh M. Garbowski
(74) Attorney, Agent, or Firm—Finnegan, Henderson, Farabow, Garrett & Dunner, L.L.P.

(57) ABSTRACT

According to a focus monitoring method, an exposure mask on which a focus monitor pattern comprising at least two types of pattern groups is formed is prepared. A pattern group A of the at least two pattern groups is illuminated with illumination light while a barycenter of an illumination light source of illumination optics is in an off-axis state. At least a pattern group B of the at least two pattern groups is illuminated with illumination light while the barycenter of the illumination light source is in an on-axis state. A positional deviation between the pattern groups A and B transferred onto a substrate is measured. An effective focus position can be monitored from this positional deviation.

43 Claims, 17 Drawing Sheets

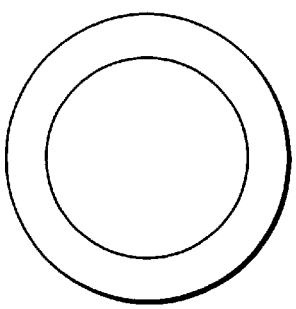
FIG. 6A
Zero order light
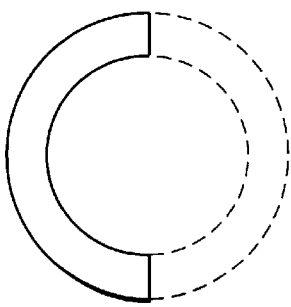
FIG. 6C
Zero order light
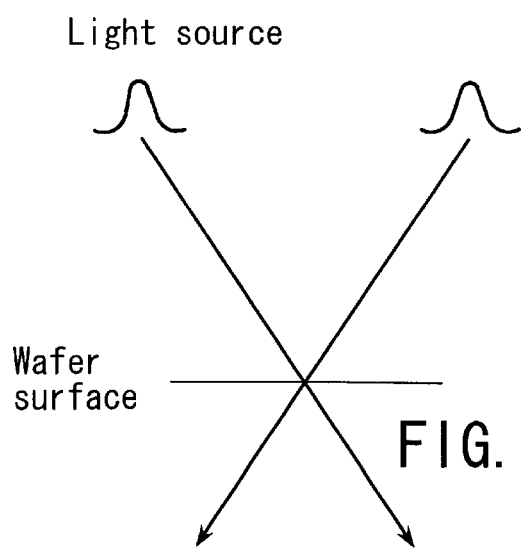
Light source
FIG. 6B
Wafer surface
FIG. 6D
Wafer surface
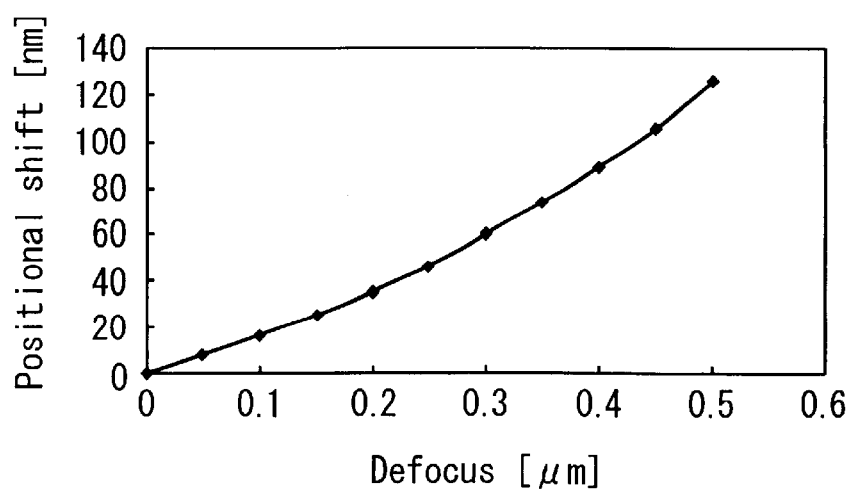
FIG. 7

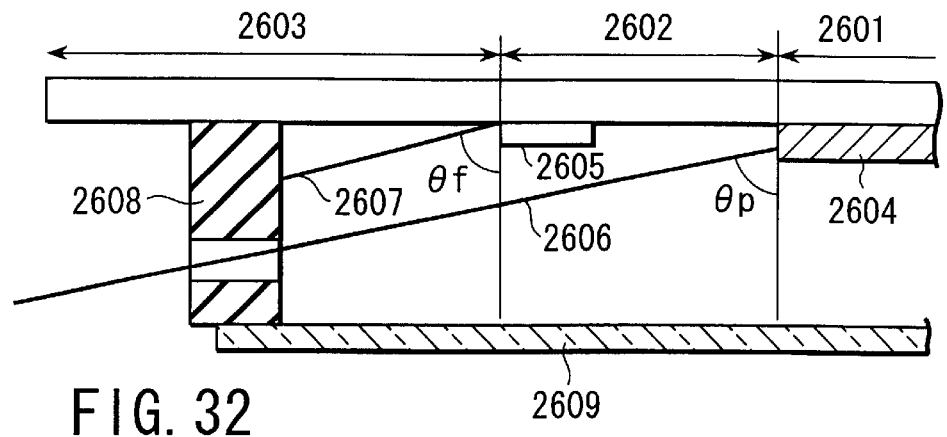
FIG. 32
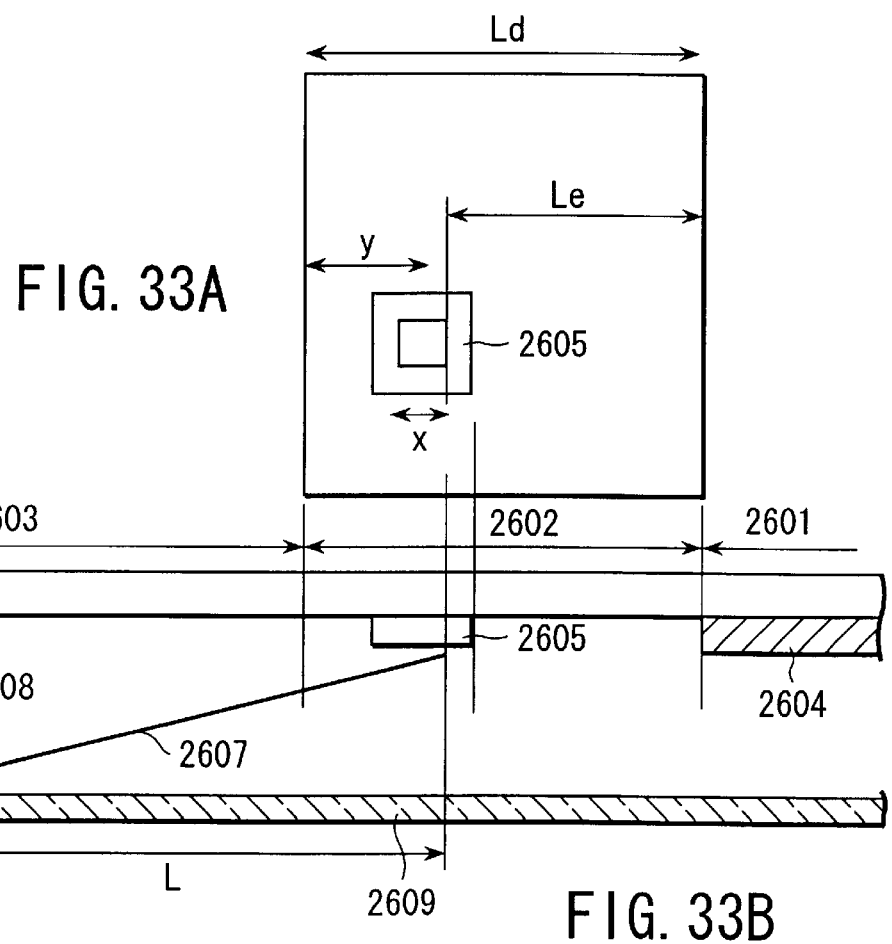
FIG. 33A
FIG. 33B

FOCUS MONITORING METHOD, EXPOSURE APPARATUS, AND EXPOSURE MASK

CROSS-REFERENCE TO RELATED APPLICATIONS

This application is based upon and claims the benefit of priority from the prior Japanese Patent Applications No. 2001-015975, filed Jan. 24, 2001; and No. 2001-090774, filed Mar. 27, 2001, the entire contents of both of which are incorporated herein by reference.

BACKGROUND OF THE INVENTION

1. Field of the Invention

The present invention relates to a focus monitoring method suitable for focus control of an exposure apparatus used in the manufacture of semiconductor elements, liquid crystal display elements, and the like, an exposure apparatus using this focus monitoring method, and a mask used in this focus monitoring method.

2. Description of the Related Art

Along with recent device micropatterning, it is becoming difficult to obtain a sufficiently large process margin such as an exposure latitude or depth of focus. To prevent a decrease in yield by effectively using a small process margin, a technique for monitoring exposure dose and focus more precisely is necessary.

According to a conventional method of managing focus, a quality controlling mask with rhombic marks 101 as shown in FIG. 1A is used. Exposure is performed while changing the focus value. A focus point where a pattern length Le of a rhombic mark 102, as shown in FIG. 1B, transferred onto a wafer becomes maximum is determined as the best focus. In this case, the relationship between the pattern length Le and defocus is as shown in FIG. 2 (see Jpn. Pat. Appln. KOKAI Publication No. 10-335208).

At the optimal focus point, even a very small portion of a rhombic mark is resolved. As defocus proceeds, the resolution for the small portion decreases. Therefore, the pattern length Le of the rhombic mark transferred onto the wafer becomes maximum at the best focus position, and has almost symmetric characteristics between positive and negative defocus directions. The rhombic mark can be applied to obtaining the best focus previous to the start of an exposure process in manufacture.

The method of this type has the following problems. Assume that the focus conditions for a manufacturing lot exposed under the same exposure conditions by using a rhombic mark are to be controlled. If merely the pattern length Le of the rhombic pattern after transfer is monitored, (1) the shift direction of the focus cannot be obtained, and (2) focus monitoring is adversely affected by variations in exposure dose.

As another focus monitoring method, a method of detecting a variation amount of the focus as a positional shift of the pattern without being adversely affected by the exposure dose has been proposed (see U.S. Pat. No. 5,300,786).

The sensitivity of focus detection by means of a mark according to this method largely depends on the shape of a light source or a coherence factor σ More specifically, with an exposure condition of a comparatively low σ, a sufficiently high sensitivity may be obtained. However, with a comparatively large σ condition, which is a generally used condition, or an annular illumination condition, a sufficiently high sensitivity cannot be obtained.

With the above method, when creating the mark, a phase shifting film must be formed. This increases the load in the mask formation. Although this method may be applied to a quality controlling mask, it is difficult to apply it to an actual device mask.

Therefore, a focus monitoring method has been sought for which can measure focus with projection optics at a high sensitivity and high precision without using a special mask for focus monitoring.

BRIEF SUMMARY OF THE INVENTION

According to a first aspect of the present invention, there is provided a focus monitoring method of transferring a focus monitor pattern on a mask illuminated with an electromagnetic wave or electron beam onto an exposure target substrate by projection optics, and measuring a shift of the pattern on the substrate, thereby monitoring an effective focus, comprising:

preparing the mask on which the focus monitor pattern comprising at least two types of pattern groups is formed;

illuminating a pattern group A of the at least two pattern groups with illumination light while a barycenter of an illumination light source of an illumination optics is in an off-axis state;

illuminating at least a pattern group B of the at least two pattern groups with illumination light while the barycenter of the illumination light source is in an on-axis state; and measuring a positional deviation between the pattern groups A and B transferred onto the substrate.

According to a second aspect of the invention, there is provided an exposure apparatus which transfers a first and a second pattern on a focus monitor mask illuminated with an electromagnetic wave or electron beam onto an exposure target substrate by projection optics, and measures the first and the second pattern on the substrate, thereby monitoring an effective focus, comprising:

illumination optics for illuminating the first pattern while a barycenter of an illumination light source is in an on-axis state, and a component interposed in the illumination optics and configured to be able to illuminate the second pattern while the barycenter thereof is in an off-axis state.

According to a third aspect of the invention, there is provided an exposure mask comprising:

a transparent substrate with a first and a second major surface, the second major surface opposing an illumination light source;

a first and a second pattern configured to focus monitor and formed on the first major surface; and a component which is arranged on or in the transparent substrate so as to shield the second pattern with respect to the illumination light source and which sets a barycenter of the illumination light source in an off-axis state.

According to a fourth aspect of the invention, there is provided an exposure mask which transfers a device pattern onto a wafer through projection optics, comprising:

a transparent substrate with a major surface;

the device pattern formed in a pattern region on the major surface of the transparent substrate;

a focus monitor pattern arranged in a region outside the pattern region on the major surface of the transparent substrate and formed from two types of patterns with different diffraction angles; and a shielding portion which shields one of positive and negative diffracted light components in two opposing directions which pass through a pupil of the projection optics and are diffracted by one pattern of the focus monitor pattern which has a larger diffraction angle.

According to a fifth aspect of the invention, there is provided a focus monitoring method employed in transferring a device pattern onto a wafer through projection optics by using an exposure mask in which a device pattern is formed in a pattern region on one major surface of a transparent substrate, comprising:

arranging, in a region outside the pattern region on one major surface of the transparent substrate, a focus monitor pattern formed from two types of patterns with different diffraction angles;

when transferring the device pattern onto a sample, performing a process of shielding one of positive and negative diffracted light components which pass through a pupil of the projection optics and are diffracted by one pattern of the focus monitor pattern which has a larger diffraction angle;

causing a positional shift between the two types of patterns of the focus monitor pattern on the sample; and detecting the positional shift as a defocus.

BRIEF DESCRIPTION OF THE SEVERAL VIEWS OF THE DRAWING

FIGS. 6A and 6B are views respectively showing the planar shape of annular illumination which is not light-shielded, and how light beams irradiate the wafer surface;

FIGS. 6C and 6D are views respectively showing the planar shape of annular illumination which is half light-shielded, and how a light beam irradiates the wafer surface;

FIG. 7 is a graph showing the relationship between a defocus and positional shift in the first embodiment;

FIG. 32 is a partial sectional view of an exposure mask according to the 15th embodiment and shows a case wherein a hole is formed in a pellicle frame and diffracted light from a device pattern is transmitted through this hole; and FIGS. 33A and 33B are views for describing the 16th embodiment, in which FIG. 33B is a partial sectional view of an exposure mask, and FIG. 33A is a partial plan view of the exposure mask to explain the definition of a distance L between a focus monitor pattern and pellicle frame when the focus monitor pattern is arranged at an arbitrary position in the dicing region.

DETAILED DESCRIPTION OF THE INVENTION

Prior to a description of the embodiments, the characteristic feature of the following first to 10th embodiments will be described.

When a focus monitor pattern is illuminated with illumination light while the barycenter of the illumination light source is in an off-axis state, a positional shift occurs on a pattern formed on the sample upon defocusing. When the monitor pattern is illuminated with illumination light in an ordinary illumination state wherein the barycenter of the illumination light source is in an on-axis state, no positional shift upon defocusing occurs in the pattern formed on the sample.

A pattern group A is illuminated with illumination light while the barycenter of the illumination light source is in an off-axis state. A pattern group B is illuminated with illumination light in an ordinary illumination state wherein the barycenter of the illumination light source is in an on-axis state. The positions of the pattern groups A and B, relative to each other, formed on the substrate are measured. Then, a defocus can be measured. The first to 10th embodiments employ this characteristic feature.

In these embodiments, as a focus monitor pattern, a box-in-box pattern used in an ordinary misalignment inspection can be used. When part of the box-in-box pattern is covered with respect to the illumination light source, the diffracted light component ratio changes under annular illumination which is used the most often as the exposure condition, or so-called telecentric shift can occur. As a result, the position of the box-in-box pattern to be transferred is shifted upon defocusing. When this positional shift is measured with a misalignment inspecting apparatus or the like, the focus value in exposure can be monitored easily. Hence, focus variation can be measured with high precision without using a specific pattern such as a phase shifting pattern.

The embodiments of the present invention will be described hereinafter with reference to the accompanying drawing.

First Embodiment

Figure 1A:
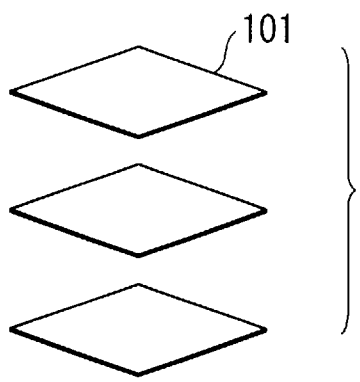
FIG. 1A shows a rhombic monitor pattern used in conventional focus monitoring.
Figure 1B:
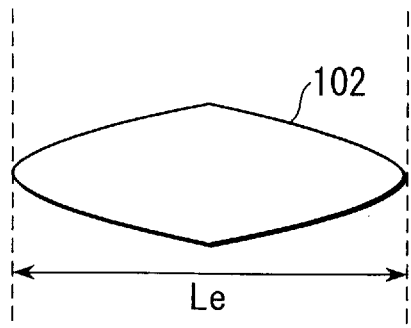
FIG. 1B shows a resist pattern obtained by transferring the rhombic pattern.
Figure 2:
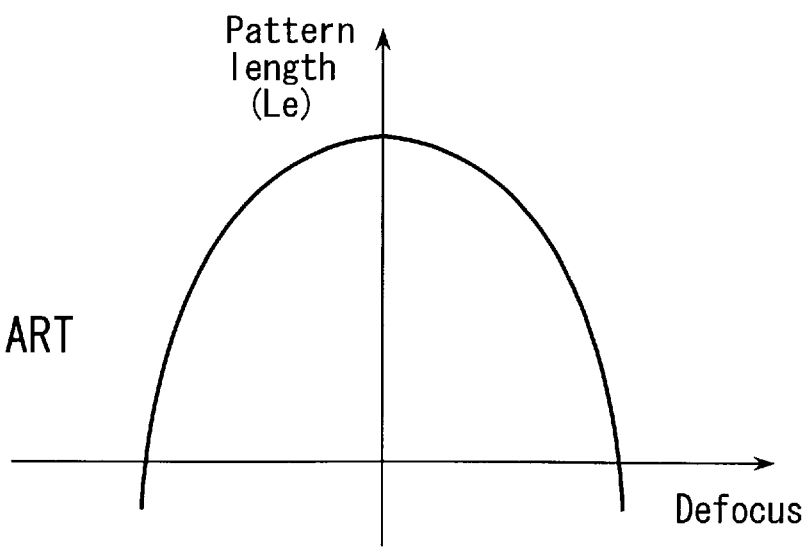
FIG. 2 is a graph showing the relationship between a pattern length obtained by transferring a rhombic monitor pattern, in the conventional focus monitoring technique, and a focus obtained at that time.
Figure 3:
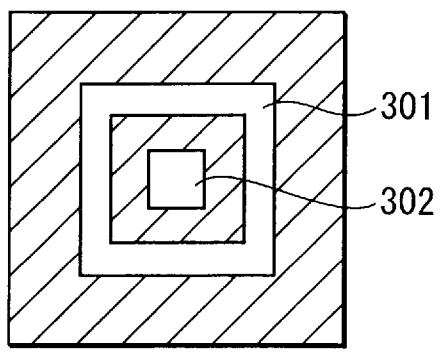
FIG. 3 is a view showing an example of a box-in-box pattern used in the first embodiment.

According to the first embodiment, as the basic arrangement of a focus monitor pattern, two or more patterns present on one mask are used. More specifically, as shown in FIG. 3, a box-in-box pattern widely used in, e.g., alignment inspection, is used. A means for shielding part of illumination light with respect to an outer or inner box pattern 301 or 302 of the box-in-box pattern is used.

Figure 4:
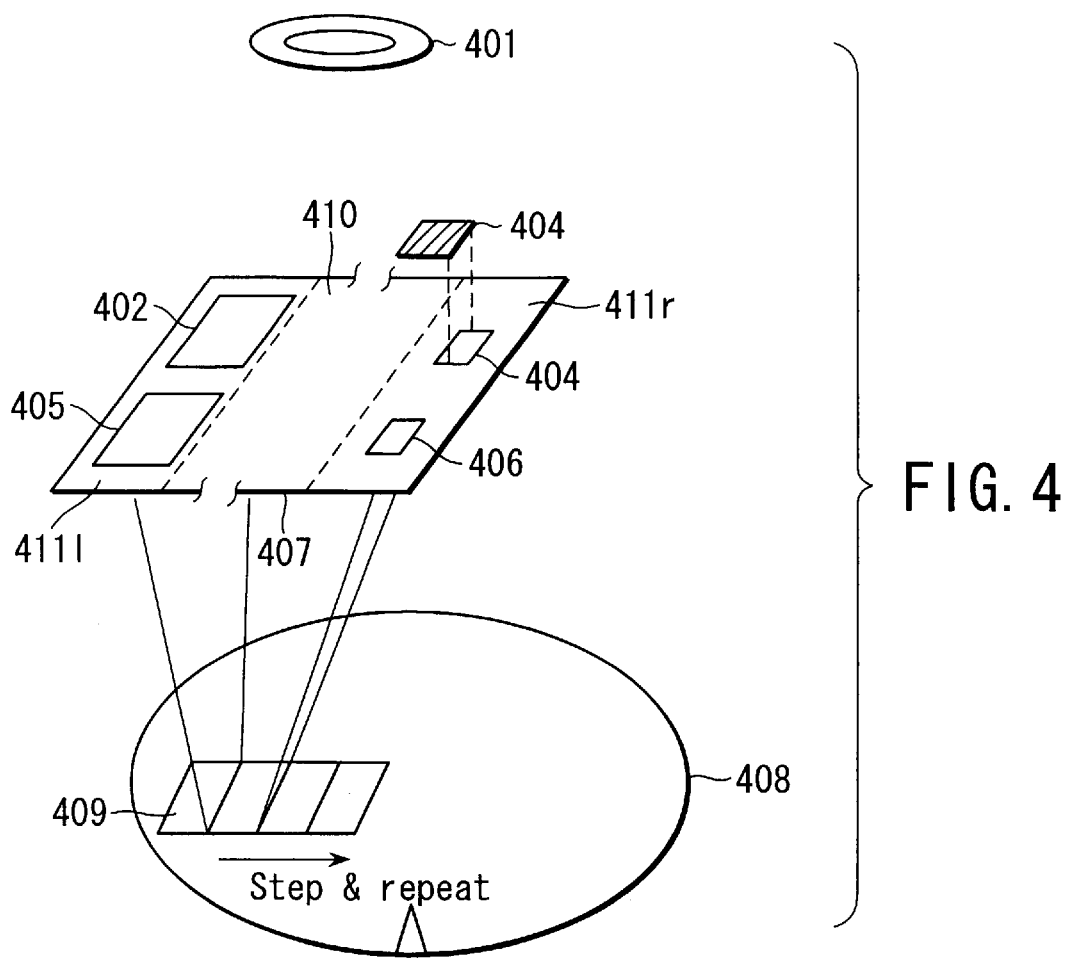
FIG. 4 is a view showing a system configuration that implements a focus monitoring method according to the first embodiment.

FIG. 4 shows a state wherein a mask 407 is illuminated by illumination (annular illumination) 401 and the pattern of the mask 407 is transferred onto a chip 409 on a wafer 408 through projection optics (not shown). As the focus monitor pattern, two pattern groups, i.e., an inner box pattern 403 (pattern group A) and inner box pattern 406 (pattern group C), and an outer box pattern 402 (pattern group B) and outer box pattern 405 (pattern group D), are respectively arranged on the two ends of the mask 407.

More specifically, the respective box patterns 402, 403, 405, and 406 are arranged in dicing line regions 411r and 411l outside a device pattern region 410 of the mask 407.

The inner box patterns 403 and 406 are arranged in the dicing line region 411r on the right side of the device pattern region 410. The outer box patterns 402 and 405 are arranged in the dicing line region 411l on the left side of the device pattern region 410. The box patterns arranged in the dicing line regions 411r and 411l can be inverted.

Regarding the inner box pattern 403, a light-shielding body 404 is arranged to shield part of illumination light that illuminates the inner box pattern 403. More specifically, the light-shielding body 404 is arranged above the mask surface opposing the illumination light source 401, to correspond to the position of the inner box pattern 403. The light-shielding body 404 may be formed in tight contact with the mask 407 so as to be integral with it. Alternatively, the light-shielding body 404 may be separated from the mask 407 and held by the exposure apparatus.

The patterns are transferred onto the wafer by using this mask. The practical procedure is as follows. First, the mask 407 is loaded in the exposure apparatus. The wafer 408 coated with a resist is introduced into the exposure apparatus. The mask pattern is transferred onto the wafer 408 by the exposure apparatus in the step-and-repeat manner as shown in FIG. 4.

This pattern transfer may be performed either by a stepper that exposes a mask pattern region at once or by a scanner that scans the mask pattern region and exposes it. The stepping amount is determined in accordance with how the device pattern is to be laid out on the wafer 408.

When exposure is performed in the above manner, it is done such that the design centers of the inner box patterns 403 and 406 and those of the outer box patterns 402 and 405 coincide with each other. More specifically, the following determination in laying out the two box patterns on the wafer 408 is important. The positions of the two box patterns must be determined such that, when exposure is performed by ideal stepping with assumed stepping, the central positions of the two box patterns coincide with each other and are exposed on the wafer.

Figure 5:
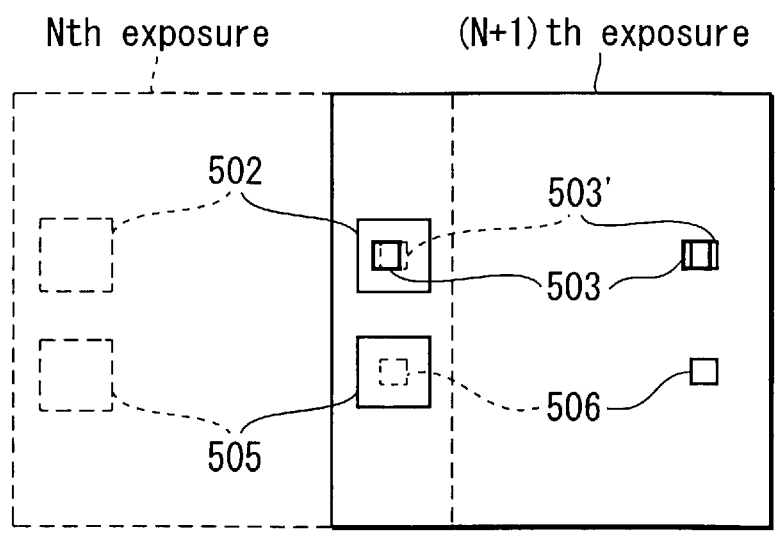
FIG. 5 is a view showing the arrangement of two chips exposed in the first embodiment and focus monitor patterns in them.

FIG. 5 is a schematic plan view of chips exposed on the wafer. Reference numerals 502, 503, 505, and 506 in FIG. 5 respectively denote the transfer patterns of the box patterns 402, 403, 405, and 406 in FIG. 4. The chip region on the left side is transferred by the Nth exposure operation, while the chip region on the right side is transferred by the (N+1)th exposure operation.

Regarding the pattern 503 exposed with partly shielded illumination light, its transferred pattern is positionally shifted upon defocusing due to the reason to be described later. With no defocus, the transfer pattern 503 should be positioned at 503' in FIG. 5, where it is overlaid on the center of the outer box pattern 502. Therefore, when the positional shifts of the box-in-box patterns 502 and 503 formed on the wafer 408 by the patterns 402 and 403 on the mask 407 are measured, focus can be monitored.

However, the box-in-box patterns are formed by exposure that takes place across the two chips. Therefore, the positional shifts of the patterns 502 and 503 include an error caused by a position precision with which the exposure apparatus is to expose the respective chips, i.e., by the stepping distortion of the projection lens.

For this reason, the box-in-box pattern formed from the patterns 505 and 506 without using a light-shielding body is employed as the reference. This pattern does not cause positional shift with respect to focus. If a defocus should occur, it is caused by a stepping distortion. When the positional shift of the box-in-box patterns formed from the patterns 505 and 506 is measured and the obtained value is subtracted from the positional shifts of the patterns 502 and 503, then the positional shift is purely caused by the focus.

Annular illumination, which is often used in actual exposure of a device pattern, will be employed as an example, and its effect will be described. As shown in FIG. 6A, when a focus monitor pattern is illuminated in a state wherein illumination is not shielded by a light-shielding body, that is, with ordinary illumination, the state of the diffracted light on the wafer surface is as shown in FIG. 6B.

When the focus monitor pattern used in the first embodiment has a comparatively large pitch, the ratio of zero order diffracted light of the diffracted light is very large. Accordingly, it can be understood that the light beam is represented by the light path of zero order diffracted light. To facilitate description, FIG. 6A schematically shows only that portion of annular illumination light which contributes to resolution and has the highest intensity. Note that this intensity originally has a distribution.

In FIG. 6B, the light intensity is obviously axially symmetrical with respect to the wafer surface. More specifically, the transferred pattern cannot be positionally shifted with respect to the focus position.

In contrast to this, when part of the illumination is shielded (half is shielded in this example) by the light-shielding body, as shown in FIG. 6C, the light intensity is no longer symmetric with respect to the wafer surface. Then, the transferred pattern is positionally shifted with respect to the focus position.

In this manner, when two sets of patterns that behave differently with respect to the focus are transferred onto the wafer and their relative positional shift can be measured, accurate focus monitoring can be performed.

FIG. 7 shows the result of the first embodiment. The abscissa represents defocus. The ordinate represents a value obtained by subtracting the relative positional shift (deviation) between the patterns 505 and 506 from the relative positional shift between the pattern 502, obtained without covering the light source with the light-shielding body, and the pattern 503, obtained by half-covering the light source with the light-shielding body. From FIG. 7, it is known that a positional shift of about 20 nm is measured with respect to a defocus of 0.1 $\mu$m, so the defocus can be sufficiently detected.

In the first embodiment, annular illumination is used as an illumination shape. The present invention is not limited to this, and the same effect can be obtained with an illumination shape other than annular illumination. In the first embodiment, the light-shielding body 404 for illumination light is arranged at a position corresponding to the inner box pattern. The present invention is not limited to this, and a light-shielding body for shielding part of the illumination light with respect to the outer box pattern may be arranged alternatively.

In this manner, according to the first embodiment, focus monitoring on the wafer during exposure can be performed with high precision. A focus monitoring method has conventionally been available. However, for this purpose, with the conventional method, a special pattern must be used, or a phase shifting film must be used. According to the first embodiment, high-precision focus monitoring can be performed without using such a special mask but by using an existing mask with a slight improvement. In measurement, the existing alignment precision measuring apparatus can be used. Hence, no new apparatus need be particularly used for this purpose.

To perform focus monitoring, the illumination is partly shielded by the light-shielding body with respect to an alignment precision measurement (focus monitor) pattern. Thus, a positional shift can be caused with respect to the focus. When this positional shift is read by an alignment inspecting apparatus, this measurement directly serves as focus monitoring of the wafer surface. According to the first embodiment, focus monitoring becomes easy, and exposure can always be performed with an appropriate focus. As a result, an increase in yield can be expected.

Second Embodiment

Figure 8:
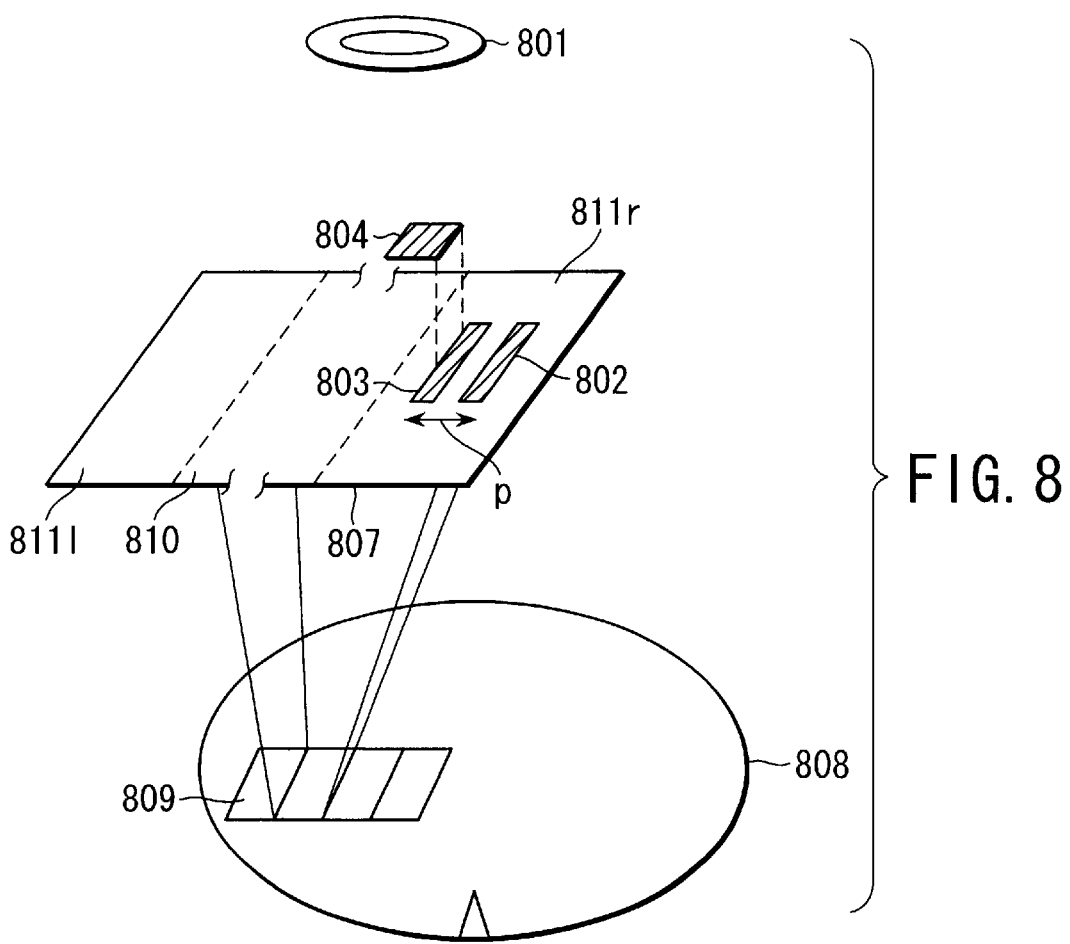
FIG. 8 is a view showing a system configuration that implements a focus monitoring method according to the second embodiment.

FIG. 8 is a view showing a system arrangement that implements a focus monitoring method according to the second embodiment of the present invention. Reference numerals 801 to 803, 807 to 810, 811$r$, and 811$l$ in FIG. 8 correspond to reference numerals 401 to 403, 407 to 410, 411$r$, and 411$l$ in FIG. 4. The second embodiment is different from the first embodiment in that pattern groups 802 and 803 are formed in one dicing line 811$r$. Note that the pattern groups 802 and 803 may be formed in another dicing line 811$l$. The pattern groups 802 and 803 do not necessarily form a box-in-box pattern but can be mere line patterns.

In the second embodiment, as the basic arrangement of the focus monitor pattern, two or more pattern groups A (803) and B (802) present adjacent to each other on one mask are used. A distance p between the pattern groups A and B is measured in advance on a mask 807. The pattern group B is exposed in an ordinary state. When exposing the pattern group A, a light-shielding body 804 as shown in FIG. 8 is arranged with respect to the illumination light. Exposure is performed while the illumination light source is in an off-axis state.

At this time, when the focus on the wafer surface is shifted, the pattern groups A and B behave differently due to the following reason. More specifically, when defocus occurs, the pattern group A is not positionally shifted by it. On the other hand, the position of the pattern group B is shifted by defocus, and the pattern group B is transferred on the wafer with this shift.

Figure 9:
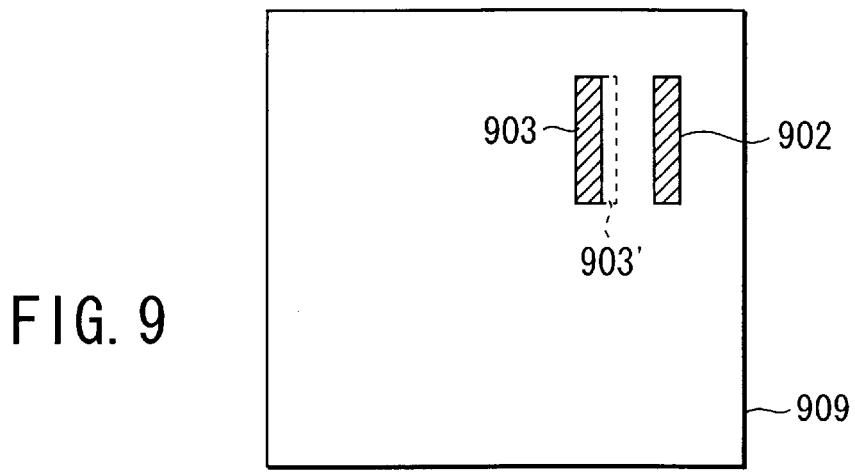
FIG. 9 is a view showing the layout of focus monitor patterns exposed onto a wafer in the second embodiment.

FIG. 9 shows transfer patterns on a wafer exposed by using this method. On a chip 909, reference numeral 903 denotes a pattern obtained by exposing the pattern group A (803). Reference numeral 903' denotes a position where the pattern group A should be transferred if defocus does not occur. In the second embodiment, the pattern group A is positionally shifted due to the defocus of the wafer surface. Reference numeral 902 denotes a pattern obtained by exposing the pattern group B (802). Off-axis does not occur in the illumination light that illuminates the pattern group B. Hence, even if defocus occurs, the pattern 902 is not positionally shifted.

The distance between the patterns 902 and 903 on the wafer is measured. The distance p, by which the patterns 902 and 903 are originally separated from each other on the wafer, is subtracted, in the form of a value converted into a value on the wafer, from the distance. Then, the positional shift of the pattern group A caused by defocus can be measured. When this positional shift is obtained, focus monitoring is enabled. As a result, the same effect as that of the first embodiment can be obtained.

Third Embodiment

Figure 10:
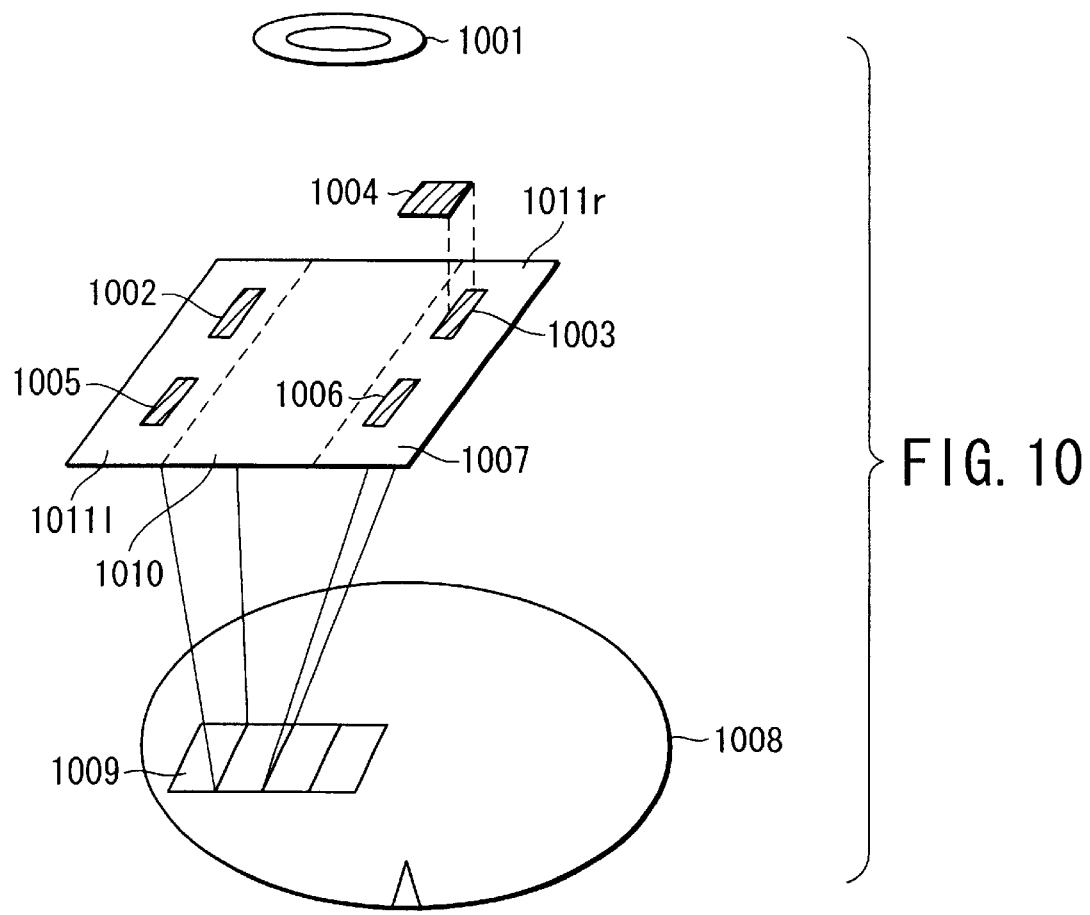
FIG. 10 is a view showing a system configuration that implements a focus monitoring method according to the third embodiment.

FIG. 10 is a view showing a system configuration that implements a focus monitoring method according to the third embodiment of the present invention. Reference numerals 1001 to 1010, 1011*r*, and 1011*l* in FIG. 10 correspond to reference numerals 401 to 410, 411*r*, and 411*l* in FIG. 4.

The third embodiment is different from the first embodiment in that line patterns are used in place of box-in-box patterns. More specifically, as shown in FIG. 10, line patterns 1003 and 1006 and line patterns 1002 and 1005 are arranged in dicing regions 1011*r* and 1011*l* on the two ends of one mask 1007. Note that line patterns 1003 and 1006 and line patterns 1002 and 1005 may be arranged in dicing regions 1011*l* and 1011*r*. A light-shielding body 1004 is arranged, only with respect to one line pattern 1003 of these patterns, above that portion of the mask which corresponds to this pattern. These patterns are arranged such that the line patterns 1003 and 1006 formed by the Nth exposure operation are precisely overlaid on the line patterns 1002 and 1005 formed by the (N+1)th exposure operation, respectively, in accordance with the step-and-repeat manner.

Of these line patterns, the line pattern 1003 is positionally shifted when defocus occurs in the same manner as in the first embodiment. When defocus occurs, the position of one of the patterns that are to be originally overlaid is shifted. Accordingly, the width of a line obtained by exposing two lines in the overlaid manner increases.

Figure 11:
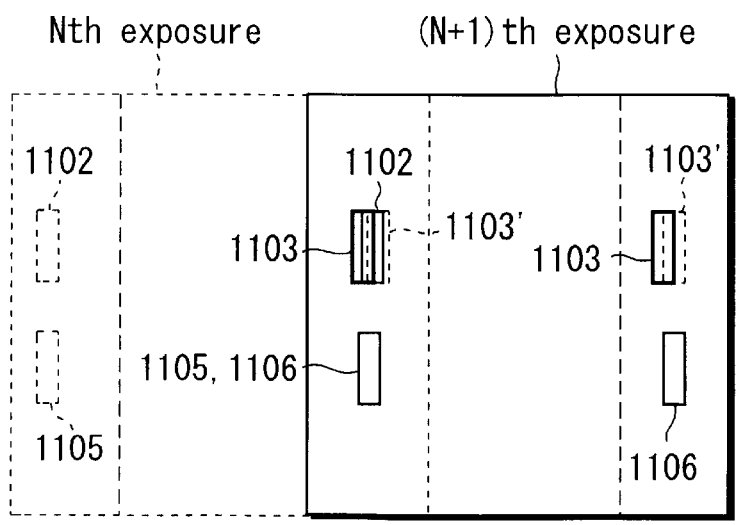
FIG. 11 is a view showing the layout of two chips exposed in the third embodiment and focus monitor patterns in them.

FIG. 11 shows an example of patterns exposed on the chips on a wafer. Reference numerals 1102, 1103, 1005, and 1106 in FIG. 11 respectively correspond to the transfer patterns of the patterns 1002, 1003, 1005, and 1006 in FIG. 10. Reference numeral 1103' denotes a position where the pattern 1103 is formed when defocus does not occur.

The factors that change the line width obtained when two patterns are formed in an overlaid manner include not only defocus but also a positional shift caused by stepping of the exposure apparatus, in the same manner as in the first embodiment. Hence, a change in line width caused by only a change in stepping precision must be monitored by using the two line patterns 1005 and 1006. Naturally, no light-shielding bodies are provided for the line patterns 1005 and 1006. The line widths of the two line patterns are measured at portions which are exposed in the overlaid manner.

The line width of the double exposure portion of the patterns 1105 and 1006 can change in accordance with stepping. In addition, the line width of the double exposure portion of the patterns 1102 and 1003 can change in accordance with focus. Therefore, when the former line width is subtracted from the latter line width, variations in line width that depend on only the focus can be observed. As shown in FIG. 7, if the relationship between the variations in line width and defocus is obtained in advance, the focus can be monitored from a change in line width.

Fourth Embodiment

Figure 12:
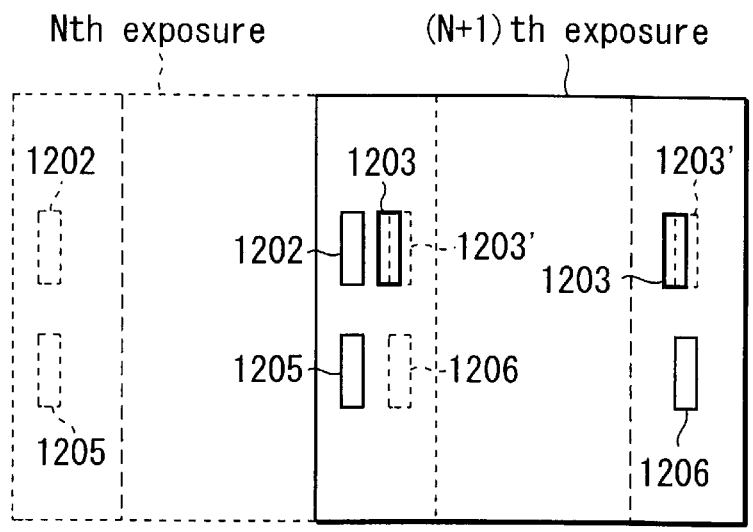
FIG. 12 is a view showing the layout of two chips exposed in the fourth embodiment and focus monitor patterns in them.

FIG. 12 describes the fourth embodiment of the present invention, and is a view showing patterns exposed on a wafer. Reference numerals 1202, 1203, 1205, and 1206 in FIG. 12 correspond to reference numerals 1102, 1103, 1105, and 1106 in FIG. 11.

In the fourth embodiment, an exposure apparatus system identical to that of FIG. 10 according to the third embodiment is used. The fourth embodiment is different from the third embodiment in that exposure is performed without arranging patterns on the two ends of the mask to be overlaid on each other. Rather, exposure is performed such that these patterns come to the vicinities of the patterns of the adjacent chips, as shown in FIG. 12. As the monitoring method, a distance between the patterns 1202 and 1203 is obtained. This distance includes both a positional shift caused by focus and a positional shift caused by stepping of the exposure apparatus. When the positional shift caused by stepping is obtained from the distance between the patterns 1205 and 1206 and subtracting it from the above distance, focus monitoring can be performed.

According to the fourth embodiment, focus monitoring can be performed in the same manner as in the third embodiment. Also, not the sizes of the patterns but a distance between the patterns is measured. Hence, the direction of defocus can also be detected.

Fifth Embodiment

Figure 13:
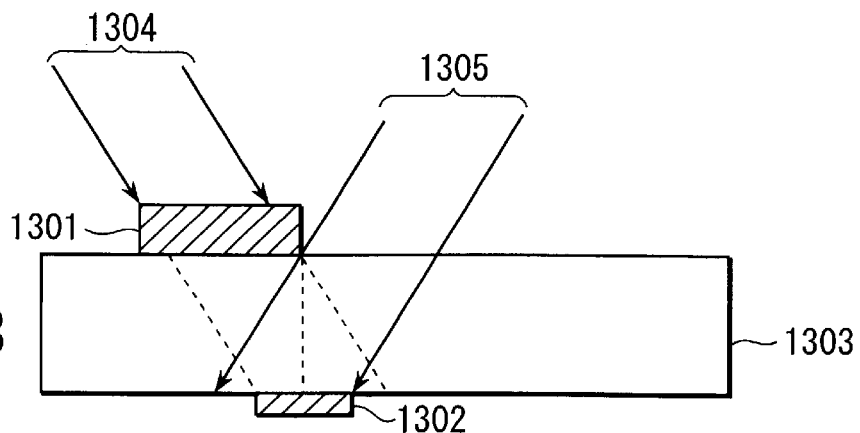
FIG. 13 is a sectional view of a mask for explaining the arrangement of a mask according to the fifth embodiment.

FIG. 13 is a sectional view of a mask used in the focus monitoring method according to the present invention. Reference numeral 1301 denotes a light-shielding body; 1302, a focus monitor pattern; and 1303, a transparent substrate.

Unlike the means for shielding illumination light in the first to fourth embodiments, the light-shielding body 1301 for shielding part of the illumination light is arranged on that surface of the mask region corresponding to the focus monitor pattern, which opposes the illumination light source, or in its vicinity. When the light-shielding body 1301 is arranged on the mask surface in this manner, part of the illumination light that should originally be used for exposure of this monitor pattern is shielded. In other words, an illumination light beam 1304 in FIG. 13 is shielded, and only an illumination light beam 1305 is used for exposure of this pattern. Hence, the barycenter of the illumination light source comes off the optical axis, and focus monitoring as described in the first to fourth embodiments can be performed.

Sixth Embodiment

Figure 14A:
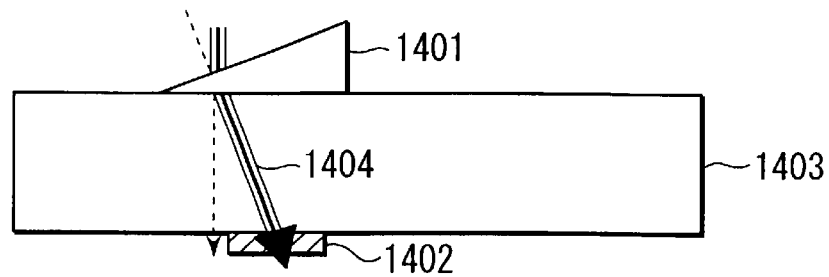
FIGS. 14A and 14B are sectional views of masks for explaining the arrangement of masks according to the sixth embodiment.

As in the sixth embodiment, in place of shielding part of the illumination light, an optical element that imparts an angle to the illumination light may be arranged on that surface of the mask region corresponding to the focus monitor pattern, which opposes the illumination light source, or in its vicinity. FIG. 14A is a sectional view of a mask in the sixth embodiment, in which reference numeral 1401 denotes an optical element; 1402, a focus monitor pattern; and 1403, a transparent substrate.

With the mask of the sixth embodiment, illumination light that becomes incident from immediately above serves as light 1404 for obliquely illuminating the focus monitor pattern 1402 on the reticle by the optical element 1401. In other words, by utilizing the optical element 1401, the focus monitor pattern 1402 can be illuminated from an oblique direction. Hence, the same effect as that of the fifth embodiment can be obtained, and focus monitoring can be performed.

Figure 14B:
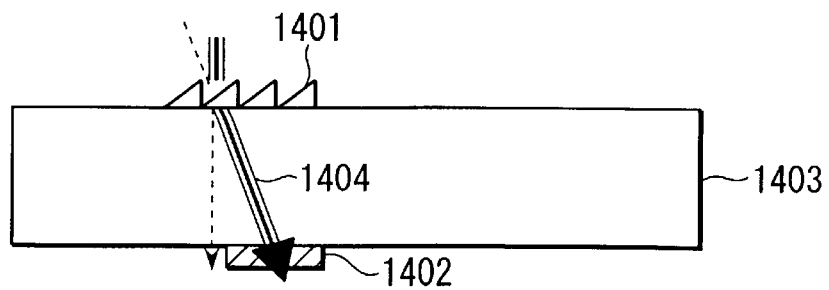

In FIG. 14A, a wedge type optical element is used. However, the present invention is not limited to this, and a grating type optical element as shown in FIG. 14B may be used instead.

Seventh Embodiment

In the fifth embodiment, a light-shielding body used for a focus monitor pattern is arranged on that surface of the mask which opposes the illumination light source. The same effect as this can be obtained when the light-shielding body is arranged at another place.

Figure 15:
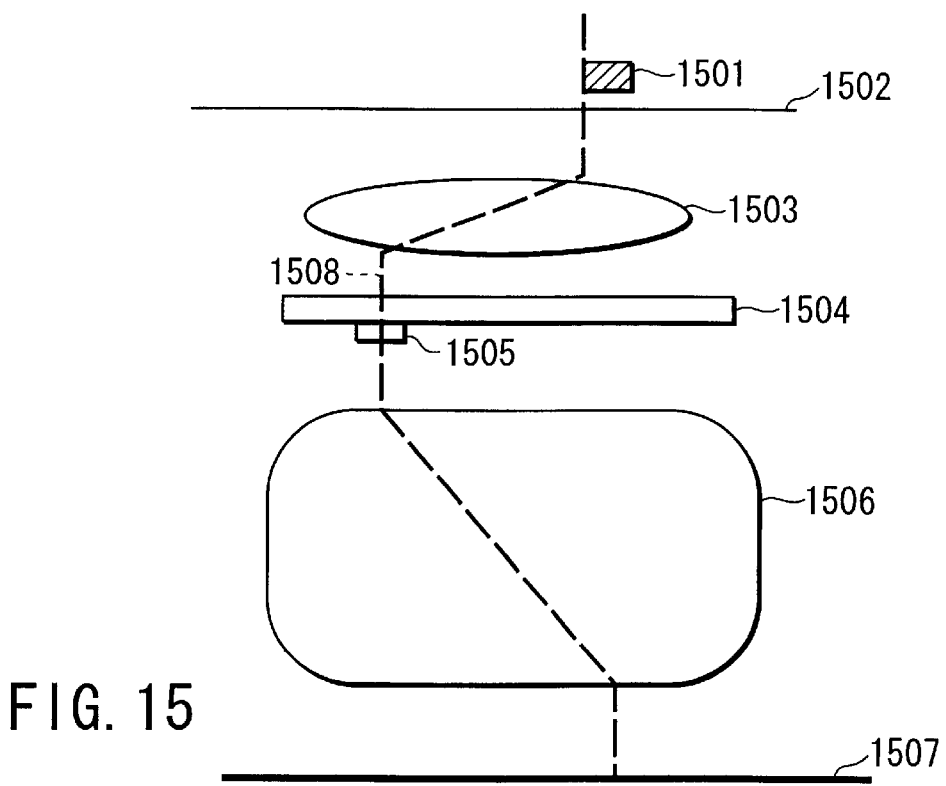
FIG. 15 is a view showing a system configuration that implements a focus monitoring method according to the seventh embodiment.

FIG. 15 is a schematic view of the seventh embodiment. Reference numeral 1501 in FIG. 15 denotes a light-shielding body; 1502, a reticle blind surface; 1503, the projection lens of illumination optics; 1504, a mask; 1505, a focus monitor pattern; 1506, the projection lens of projection optics; 1507, a wafer surface; and 1508, illumination light, respectively.

According to the seventh embodiment, the light-shielding body 1501 is arranged in the vicinity of the reticle blind surface 1502 which is almost optically conjugate to that surface of the mask 1504 which opposes the illumination light source. The box pattern 1505 identical to that described in the first embodiment, or a focus monitor pattern identical to that described in the third embodiment is illuminated. The light-shielding body 1501 has a function equivalent to that of the light-shielding body 1301 of the fifth embodiment. Thus, the same effect as that of the fifth embodiment can be obtained, and focus monitoring can be performed.

The light-shielding body 1501 can be provided as a constituent component of the exposure apparatus. If the size and installation place of the focus monitor pattern are standardized, the light-shielding body 1501 provided standard to the exposure apparatus can be shared by various types of masks. Alternatively, the light-shielding body 1501 may be exchanged for each mask.

In the seventh embodiment, the light-shielding body is arranged near the reticle blind surface. However, the present invention is not limited to this, and the light-shielding body may be arranged at any other place as far as it is optically conjugate.

Eighth Embodiment

In the seventh embodiment, focus monitoring is enabled by arranging the light-shielding body in the vicinity of the reticle blind surface. Focus monitoring is enabled also by arranging an optical element like one used in the sixth embodiment on the reticle blind surface.

Figure 16A:
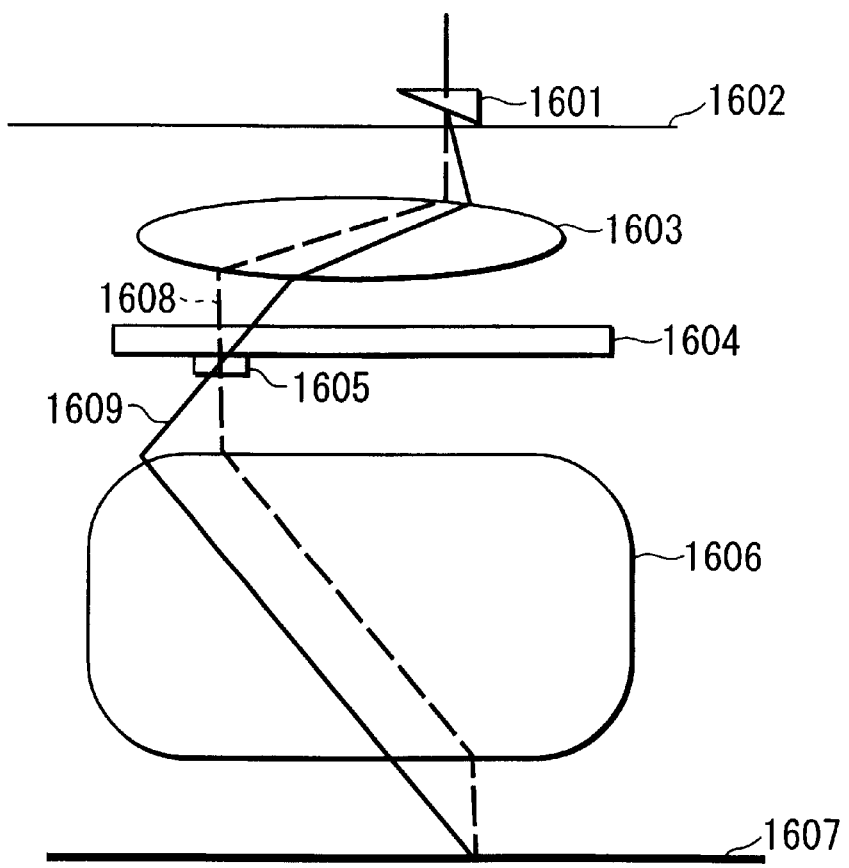
FIG. 16A is a view showing a system configuration that implements a focus monitoring method according to the eighth embodiment.

FIG. 16A shows the schematic arrangement of the eighth embodiment. Reference numerals 1601 to 1608 in FIG. 16A correspond to reference numerals 1501 to 1508 in FIG. 15. Reference numeral 1609 denotes illumination light inclined by an optical element 1601.

When illumination light corresponding to a focus monitor pattern 1605 is inclined by the optical element 1601 arranged in the vicinity of a reticle blind surface 1602 almost conjugate to that surface of a mask 1604 which opposes the illumination light source, the same effect as that of the seventh embodiment can be produced.

Figure 16B:
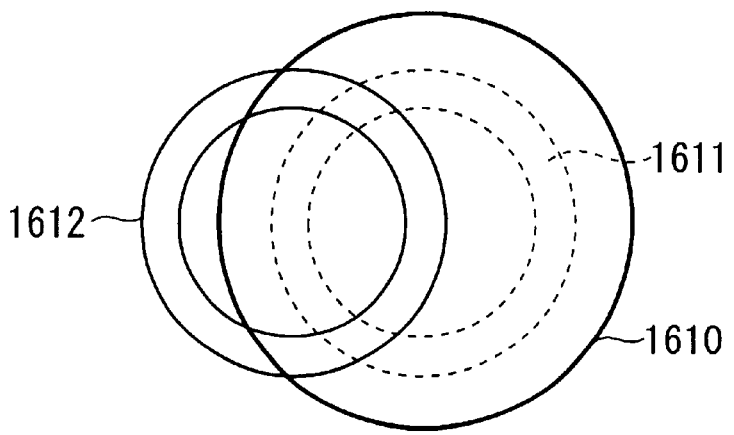
FIG. 16B is a view showing the position of illumination light on a pupil surface in the eighth embodiment.

FIG. 16B shows the position of illumination light on the pupil surface. In FIG. 16B, the illumination is annular illumination. Reference numeral 1610 denotes the aperture of the projection lens. When the central position of the illumination light is shifted from the central position of the aperture of the projection lens to, e.g., the position 1612 with respect to a position 1611 of the illumination light that must originally be transmitted through the pupil surface, a light intensity distribution asymmetric with the wafer surface as shown in FIG. 6C can be formed. Since the monitor pattern is positionally shifted with respect to the focus, focus monitoring can be performed.

Figure 17:
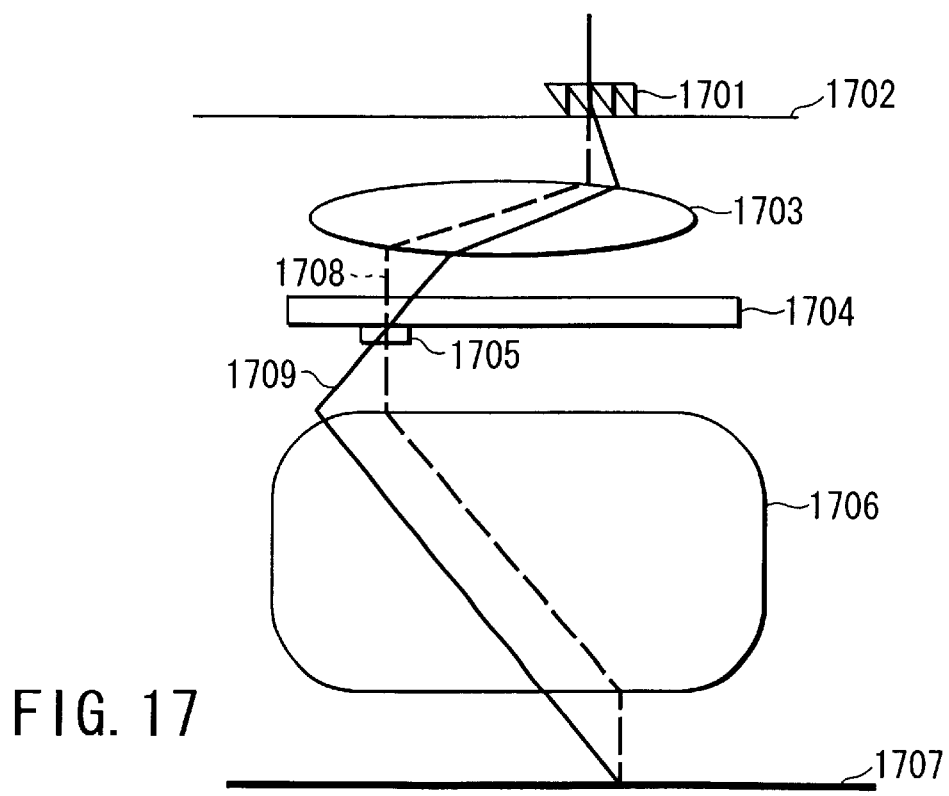
FIG. 17 is a view showing another system configuration according to the eighth embodiment.

In FIG. 16A, a wedge type optical element is used. However, the present invention is not limited to this, and a grating type optical element as shown in FIG. 17 may also be used instead. Reference numerals 1701 to 1709 in FIG. 17 respectively correspond to reference numerals 1601 to 1609 in FIG. 16.

The light-shielding body 1601 can be provided as a constituent component of the exposure apparatus. If the size and installation place of the focus monitor pattern are standardized, the light-shielding body 1601 provided standard to the exposure apparatus can be shared by various types of masks. Alternatively, the light-shielding body 1601 may be exchanged for each mask.

In the eighth embodiment, the optical element is arranged near the reticle blind surface. However, the present invention is not limited to this, and the optical element may be arranged at any other place as far as it is optically conjugate.

Ninth Embodiment

In the seventh embodiment, a light-shielding body is arranged on that surface of the mask which opposes the illumination light source, to shield part of illumination light to the focus monitor pattern. In this case, an influence on a device pattern present on the same mask must also be considered. More specifically, if light which should be used for exposure of the device pattern is shielded, it may largely influence the device pattern that should originally be exposed in the normal manner. Therefore, this focus monitoring method must be performed while avoiding an influence on the device pattern.

Figure 18A:
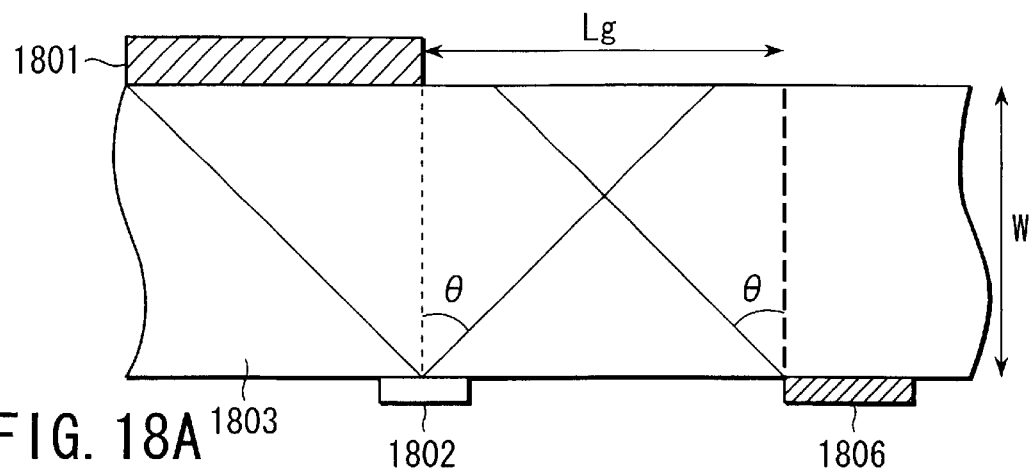
FIGS. 18A and 18B are sectional views of masks for explaining the arrangement of masks according to the ninth embodiment.

FIG. 18A shows an example of a sectional view of the mask. In FIG. 18A, reference numeral 1801 denotes a light-shielding body; 1802, a focus monitor pattern; 1803, a transparent substrate; and 1806, a device pattern present on the mask. The positional relationship between the light-shielding body 1801, focus monitor pattern 1802, and device pattern 1806 is as shown in FIG. 18A. The edge of the light-shielding body 1801 is to correspond to the central position of the focus monitor pattern 1802.

To prevent the illumination light that is to expose the device pattern from being shielded by the light-shielding body 1801, the focus monitor pattern 1802 must be moved from the endmost portion of the device pattern and arranged at a position where the following equation (1) is satisfied:

$$Lg > w \times \tan\theta \quad (1)$$

where Lg is the distance from the device pattern to the box-in-box pattern, W is the thickness of the mask, and $\theta$ is the illumination angle in the mask member. The illumination angle $\theta$ is an angle determined by $\sin\theta = NA/nM$ where NA is the wafer side numerical aperture of the projection lens, $n$ is the refractive index of the mask material (usually $SiO_2$) for exposure light, and M is the magnification of the mask.

Figure 18B:
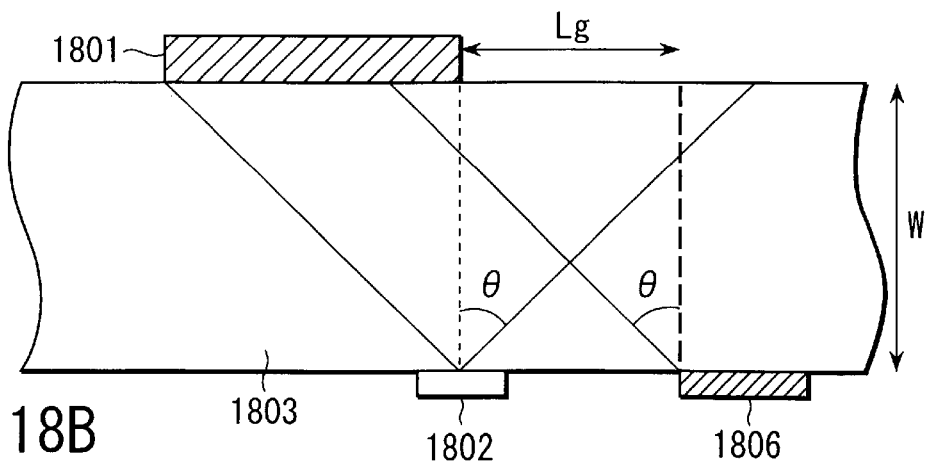

If this condition is not satisfied, the mask becomes as shown in FIG. 18B. Then, the illumination light that should expose the device pattern is also shielded by the light-shielding body 1801 on the lower surface of the box pattern. If equation (1) is satisfied, focus monitoring can be performed so as not to adversely affect the device pattern at all.

10th Embodiment

In the fifth embodiment, the light-shielding body is arranged on that surface of the mask which opposes the illumination light source, in order to shield light to the box pattern. To eliminate any adverse affect on the device pattern, equation (1) must be satisfied (FIG. 18A). However, as the thickness of the mask is determined, the focus monitor pattern must be separated from the device pattern region by at least $W \times \tan\theta$. This leads to an increase in chip area. To reduce the chip area, this distance may be minimized.

Figure 19:
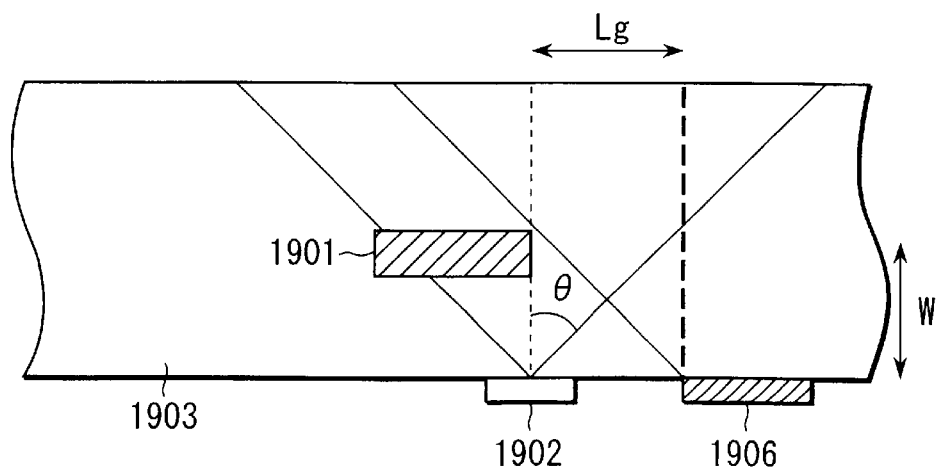
FIG. 19 is a sectional view of a mask for explaining the arrangement of a mask according to the 10th embodiment.

FIG. 19 shows a sectional view of a mask according to the 10th embodiment to show its arrangement. In FIG. 19, reference numeral 1901 denotes a light-shielding body; 1902, a focus monitor pattern; 1903, a transparent substrate; and 1906, a device pattern present on the mask. As shown in FIG. 19, if the light-shielding body 1901 can be buried in the transparent substrate 1903 or in the substrate, W of equation (1) decreases. The focus monitor pattern can be accordingly arranged closer to the device pattern region by an amount corresponding to this decrease.

When this mask is used, focus monitoring can be performed with the distance Lg between the device pattern and focus monitor pattern being further decreased. This leads to a reduction in chip area.

As described above in detail, according to the first to 10th embodiments, the focus monitor pattern group A formed on the mask is illuminated with illumination light while the barycenter of the illumination light source is in an off-axis state. Another pattern group B is illuminated with ordinary illumination light while the barycenter of the illumination light source is in an on-axis state. The positions of the pattern groups A and B, formed on the substrate, relative to each other may be measured, thereby measuring defocus. In this case, the focus of the projection optics can be measured with high sensitivity and high precision without using a specific mask for focus monitoring.

In the first to 10th embodiments, the illumination light for part of the focus monitor pattern is in an off-axis state, to cause a pattern shift, thereby performing focus monitoring. The method of causing a pattern shift is not limited to that described in the above embodiments. Other methods of causing a pattern shift will be described in the following 11th to 16th embodiments. Prior to description of the practical embodiments, the characteristic feature that is common among the following embodiments will be described.

The pattern used in the following embodiments is formed by altering part of a pattern used in alignment precision measurement, e.g., a box-in-box pattern also used in the first embodiment. The position of this pattern is appropriately set with respect to the actual device pattern. This is the characteristic feature of the following embodiments.

Figure 20:
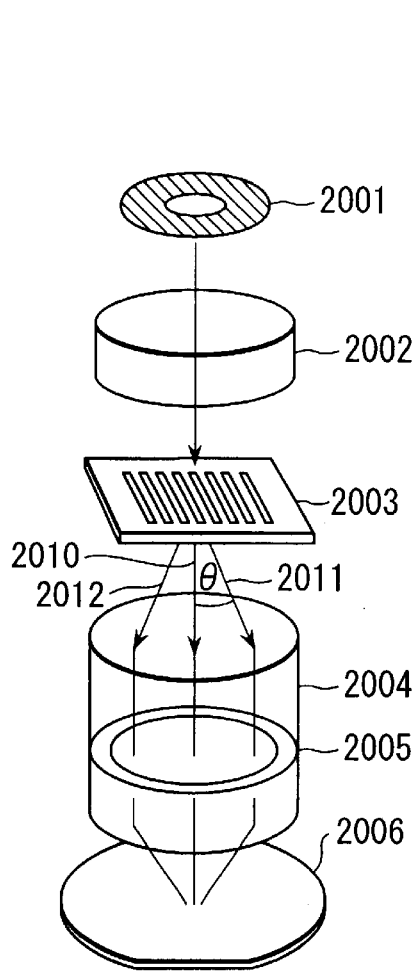
FIG. 20 is a schematic view for explaining the main part of an exposure apparatus and diffracted light.

FIG. 20 shows an optics in a general exposure apparatus. Referring to FIG. 20, reference numeral 2001 denotes an illumination light source; and 2002, a condenser lens. The condenser lens 2002 is the main element of the illumination optics. Reference numeral 2003 denotes an exposure mask; 2004, a reduction projection lens as the main element of the projection optics; 2005, a pupil surface; and 2006, a wafer. Light emitted from the illumination optics to irradiate the exposure mask 2003 is diffracted by the mask surface and is divided into zero order light 2010, +1st order light 2011, −1st order light 2012, and the like.

Under the illumination condition symmetric with respect to the optical axis, assume a case wherein a telecentric shift does not exist and those components of the diffracted light which are concerned in pattern formation are +1st order light, zero order light, and −1st order light. Also assume a case wherein the illumination is not shielded by other than the pupil surface of the projection optics but entirely reaches the wafer. As far as no telecentric shift is present, even if the focus position is shifted, the pattern to be transferred is not positionally shifted.

However, of positive and negative diffracted components, if only one diffracted component (e.g., the +1st order light) can be shielded by some means before it reaches the wafer, the ratio of the two-beam interfering components of the zero order light and −1st order light to the two-beam interfering components of the zero order light and +1st order light on the wafer changes. Thus, when defocus occurs, it can be detected as a positional shift of the pattern.

By utilizing the two effects described above, in the following embodiments, an actual device pattern is arranged at a position where it does not shield the diffracted light, and the focus monitor pattern is arranged at a position where it shields the diffracted light, or is processed to shield the diffracted light. With the above arrangement, if the positional shift of the focus monitor pattern is measured with an alignment precision measuring apparatus, defocus can be easily measured with high precision.

More specifically, as the focus monitor pattern, a box-in-box pattern is used. Of inner and outer patterns, one is formed with a small pitch, while the other is formed with a large pitch. The diffraction angle of the diffracted light from the small-pitch pattern is larger than that of the diffracted light from the large-pitch pattern. Hence, the pitches are set such that the former diffracted light is shielded while the latter diffracted light is not shielded. In other words, with the former diffracted light, a positional shift is caused by defocus. With the latter diffracted light, a positional shift is not caused by defocus.

Then, when defocus occurs, only one pattern is positionally shifted. Therefore, focus monitoring can be performed by detecting a shift between the inner and outer patterns. In addition, when the focus monitor pattern is arranged outside a region where the device pattern is formed, focus monitoring described above can be performed without limiting the device pattern region at all.

Therefore, according to the following embodiments, the focus of the projection optics can be measured with high sensitivity and high precision without using a specific mask for focus monitoring. The embodiments of the present invention will be described with reference to the accompanying drawings.

11th Embodiment

In the 11th embodiment, as a focus monitor pattern, a box-in-box pattern mark with which a positional shift can be detected by an alignment precision measuring apparatus is used. This mark is partly improved to have a focus detection effect, and the arrangement of the mark itself is devised.

FIGS. 21A to 21F are plan views of focus monitor patterns used in the 11th embodiment. Each focus monitor pattern is constituted by an outer large-width large box mark (pattern) 2301 and a small box mark (pattern) 2302. The large box mark 2301 has an opening. The small box mark 2302 is formed inside the opening and is made from fine patterns.

Figure 21A:
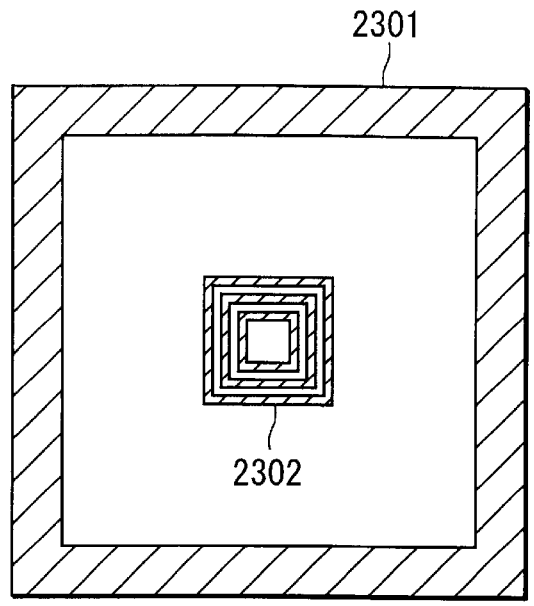
FIGS. 21A to 21F are plan views showing examples of a box-in-box type focus monitor pattern used in the above embodiments.
Figure 21B:
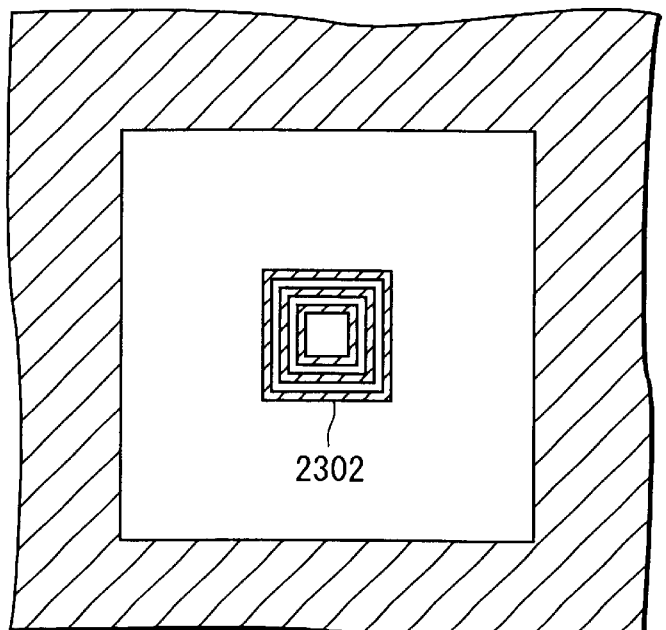

The large box mark 2301 may have a predetermined width, as shown in FIG. 21A, or have an opening in the light-shielding surface, as shown in FIG. 21B. In FIG. 21A, a plurality of large-width patterns may be concentrically formed.

Figure 21C:
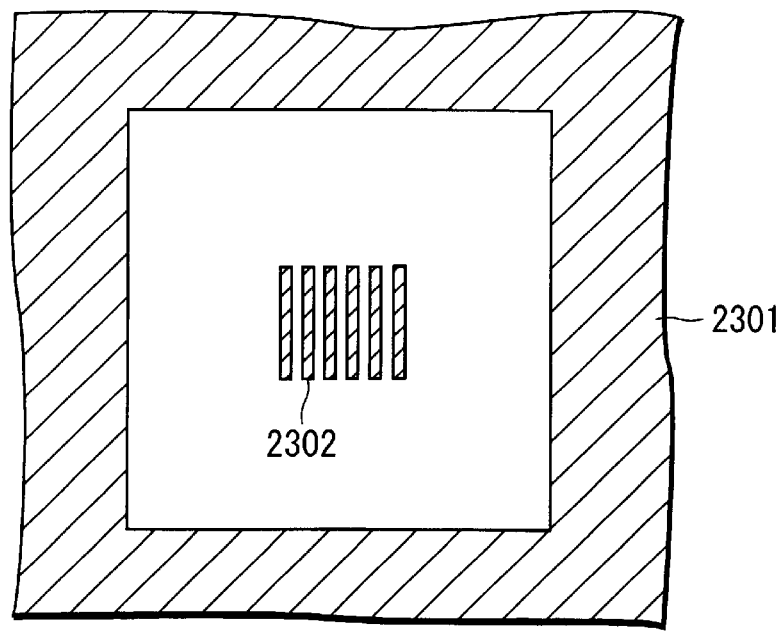
Figure 21D:
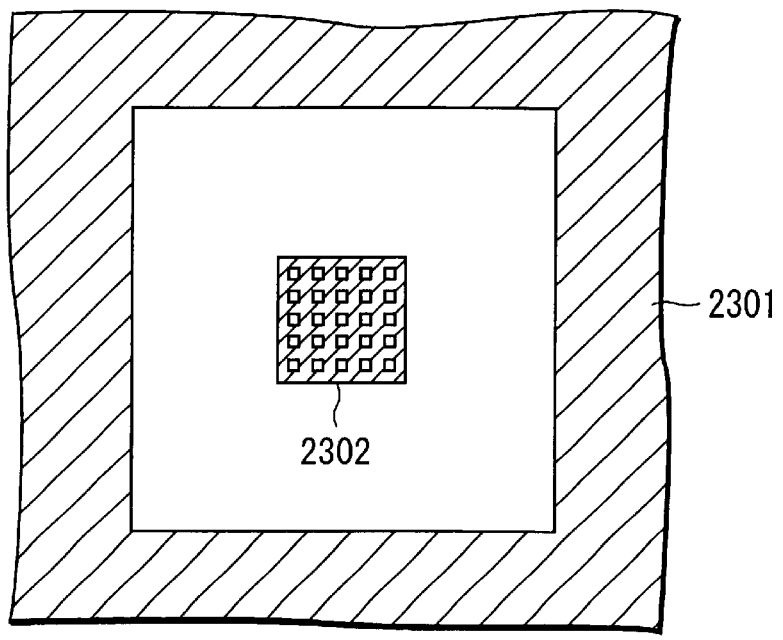

The small box mark 2302 inside the large box mark 2301 may form a line-and-space (L/S) pattern with thin square patterns, as shown in FIGS. 21A and 21B, may be formed from a simple L/S pattern, as shown in FIG. 21C, or may be formed from a checkered pattern, as shown in FIG. 23D.

Figure 21E:
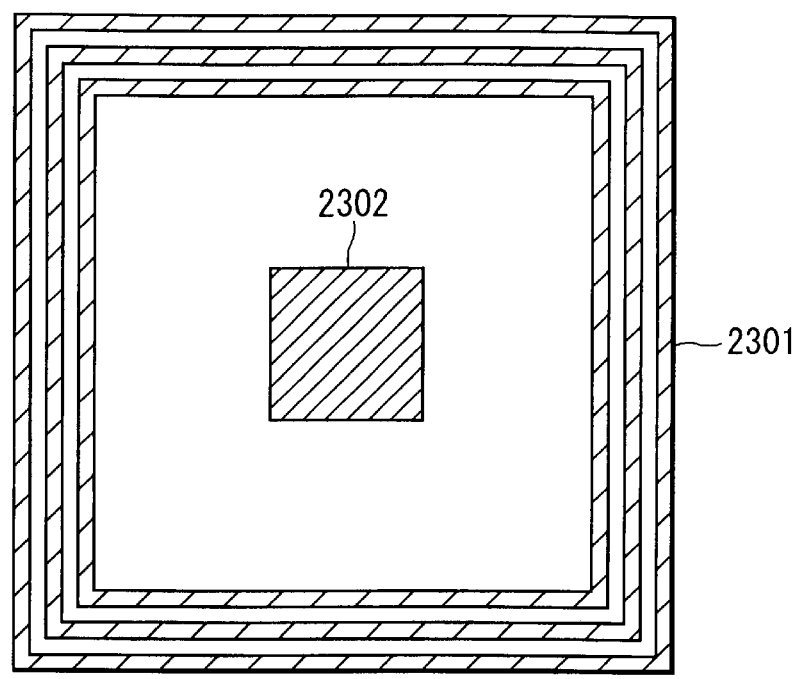
Figure 21F:
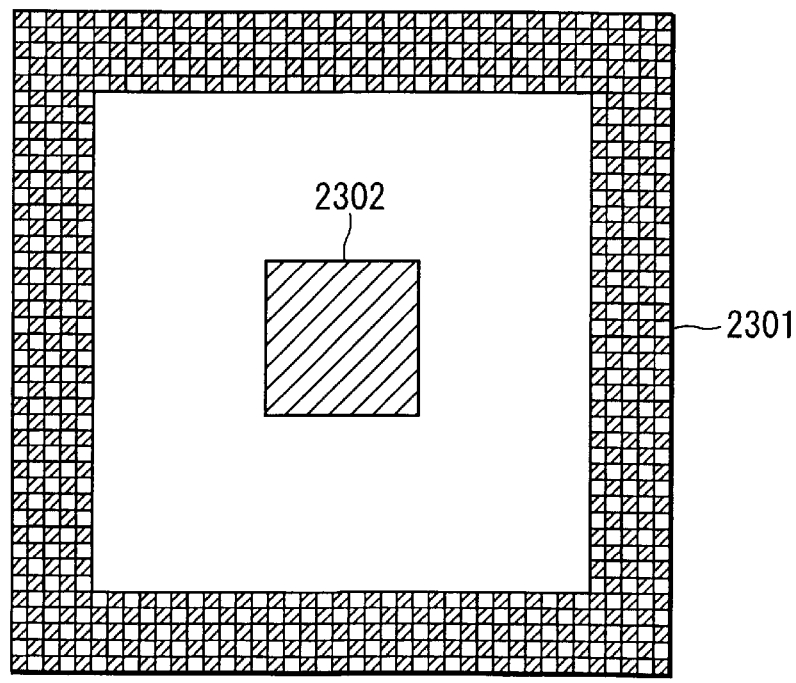

As an improvement of the focus monitor pattern, one in which the inner and outer patterns are inverted, as shown in FIGS. 21E and 21F, may be used. More specifically, an outer large box mark 2301 may be formed from fine patterns (L/S or checkered pattern), and an inner small box mark 2302 may be formed from large-width patterns (a rectangle with a large area).

In the following description, the outer large box mark 2301 is formed from large-width patterns, and the inner small box mark 2302 is formed from fine patterns, as shown in FIGS. 21A to 21D.

In the focus monitor pattern as shown in each of FIGS. 21A to 21D, of ±1st order light components (1st order light components with positive and negative signs) from the inner small box mark 2302, if only one can be shielded by some means, the ratio of the two-beam components of the zero order light and +1st order light to the two-beam components of the zero order light and −1st order light on the wafer changes. Thus, when the focus position is shifted, the pattern itself is positionally shifted, and the positionally shifted pattern is transferred onto the wafer.

Conversely, as the outer large box mark 2301, a comparatively large pattern designed so the diffracted light is not shielded by it is employed. With this setting, the relative shift of the two transfer patterns is measured by using the alignment precision measuring apparatus. Thus, a defocus amount can be detected easily.

When, however, the two diffracted light components from the device pattern on the exposure mask are shielded simultaneously, while the focus precision can be measured, the image forming characteristics of the device pattern itself, which is crucial, may be adversely affected. Hence, a countermeasure must be taken with which only one of the two 1st order diffracted light components from the small box mark of the box-in-box pattern, which is the focus monitor pattern, is shielded without shielding the diffracted light from the device pattern. This countermeasure will be described.

According to the eleventh embodiment, as a means for shielding only one of the 1st order diffracted light components from the small box mark of the box-in-box pattern, a pellicle frame is utilized. The pellicle frame supports a pellicle film that protects the surface of the exposure mask. The exposure mask generally serves for exposure with the pellicle film being attached to it. With a pellicle frame, no new process need be introduced in mask fabrication, and the cost does not increase.

Figure 22:
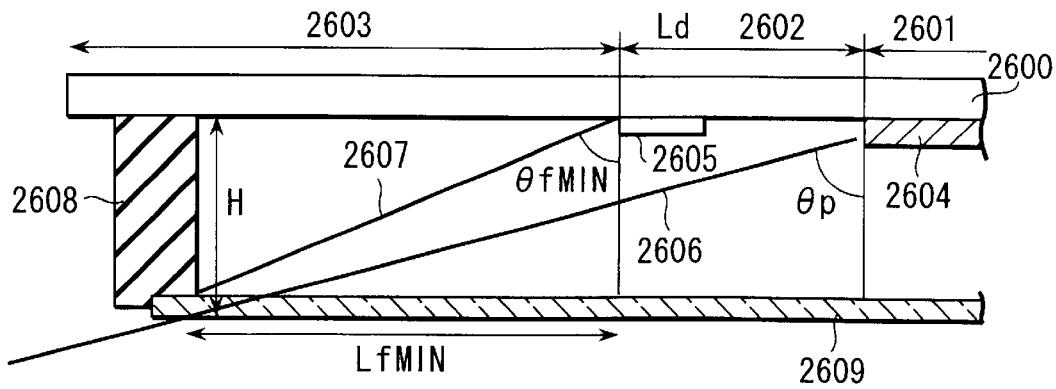
FIG. 22 is a partial sectional view of an exposure mask to show the positional relationship between a focus monitor pattern and pellicle frame in the 11th embodiment, and shows a case wherein the 1st order diffraction angle from the focus monitor pattern is minimum.

FIG. 22 shows, together with a partial sectional view of an exposure mask, the positional relationship between a device pattern 2604 and box-in-box type focus monitor pattern 2605, and that between a pellicle frame 2608 and pellicle film 2609. In FIG. 22, reference numeral 2600 denotes a transparent substrate which is transparent with respect to exposure light; 2601, a pattern region where an actual device pattern is present; 2602, a dicing region where the focus monitor pattern 2605 and an alignment mark are present; and 2603, a periphery where the mask alignment mark is arranged.

The focus monitor pattern 2605 is indicated by the outer shape of the section (or side surface) of an outer large box pattern 2301 (FIG. 21A). The focus monitor pattern 2605 has an inner small box pattern 2302 (FIG. 21A) in it, although its detailed illustration is omitted.

According to the 11th embodiment, the focus monitor pattern 2605 is arranged at the outermost portion of the dicing region 2602. Diffracted light from the dicing region 2602, which is effective for forming an image, is not shielded by the pellicle frame 2608. Only light from the inner pattern of the focus monitor pattern 2605 is shielded. The practical procedure of determining this arrangement will be described as follows.

In the exposure apparatus, the numerical aperture (NA) is determined in advance. When an n-time mask is used, the maximum diffraction angle ($\theta$ p) of the 1st order diffracted light is limited to satisfy $\sin \theta\ p = NA/n$. In other words, even when the 1st order diffracted light is diffracted at an angle of $\theta$ p, i.e., $\sin^{-1}(NA/n)$, or more, it can not transmit through the pupil of the projection optics. Hence, the maximum diffraction angle need not be considered here.

Assume a case wherein the diffracted light 2607 from the small box mark of the focus monitor pattern 2605 is to be shielded by the pellicle frame 2608. If the height H of the pellicle frame 2608 is determined, the position at which the pellicle frame 2608 does not shield diffracted light 2606 from the pattern region 2601 is determined. This position is shown in FIG. 22 in the form of the distance from the end of the dicing region 2602 to the pellicle frame 2608, and its minimum distance is expressed by $L_{fMIN}$. Conversely, if this distance is larger than $L_{fMIN}$, the 1st order diffracted light 2606 from the pattern region 2601 is not shielded by the pellicle frame 2608.

To shield the 1st order diffracted light from the small box mark involved in the monitor pattern 2605, the height H of the pellicle frame 2608, $L_{fMIN}$, and the minimum diffracted angle $\theta_{fMIN}$ of the diffracted light from the small box mark may satisfy a relation $\tan \theta_{fMIN} > L_{fMIN}/H$.

From the above description, the small box mark may be formed from fine patterns so that the 1st order diffracted light is diffracted within a range where $\tan^{-1}(L_{fMIN}/H) < \theta_{fMIN} < \sin^{-1}(NA/n)$ is established.

This condition of angle will be studied from the viewpoint of the pitch of the small box mark. Generally, the relationship between light diffracted by a diffraction grating (corresponding to a mask pattern in this case) and the diffraction angle satisfies $d \cos \theta = m\lambda$ where $\theta$ is the diffraction angle, d is the pitch of the mask pattern, $\lambda$ is the exposure wavelength, and m is the order of diffraction. As the order of diffraction, only 1st order will be considered in this case. Hence, this equation becomes $\cos \theta = \lambda/d$ when m=1. When this result is further substituted in the above equation of condition about the diffraction angle $\theta_f$ from the small box mark, it yields:

$$\tan^{-1}(L_{fMIN}/H) < \cos^{-1}(\lambda/d) < \sin^{-1}(NA/n) \qquad (2)$$

If the pattern pitch is set to satisfy this condition, the diffracted light from the device pattern 2604 is not shielded, and only one component of the 1st order diffracted light from the small box pattern can be shielded.

Figure 23:
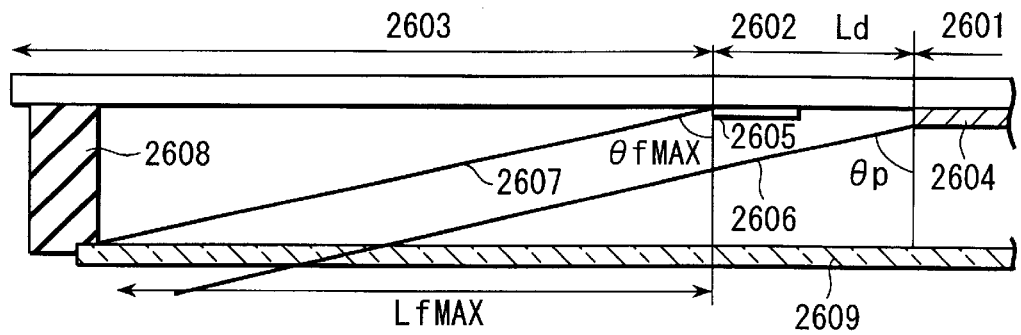
FIG. 23 is a partial sectional view of the exposure mask to show the positional relationship between the focus monitor pattern and pellicle frame in the 11th embodiment, and shows a case wherein the 1st order diffraction angle from the focus monitor pattern is maximum.
Figure 24:
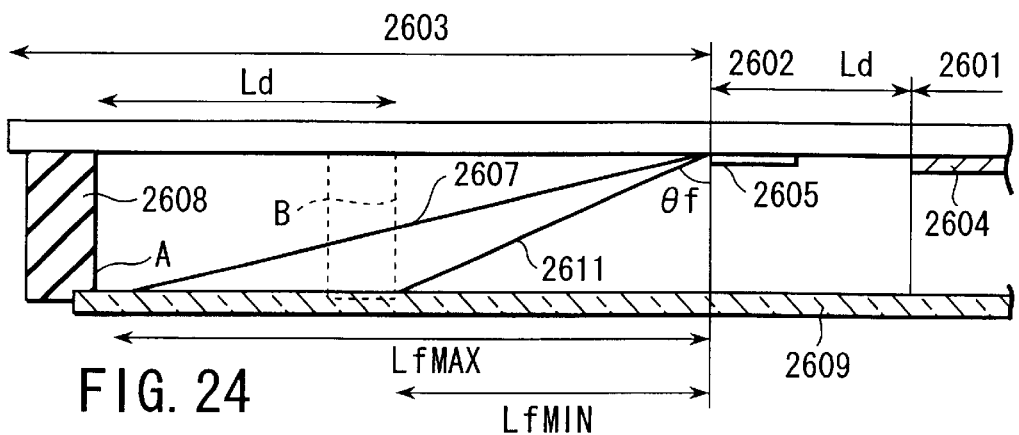
FIG. 24 is a partial sectional view of the exposure mask to show the positional relationship between the focus monitor pattern and pellicle frame in the 11th embodiment, and shows the range of minimum to maximum 1st order diffraction angles.

Assuming that the pitch of the small box mark is determined to a certain constant value within the above range, the position where the pellicle for shielding only the 1st order diffracted light beam from such small box mark will be considered. FIG. 22 shows a case wherein the diffraction angle satisfying this condition is minimum ($\theta_{fMIN}$) FIG. 23 shows a case wherein this angle becomes maximum. In FIG. 23, diffracted light beams 2606 and 2607 respectively from the device pattern 2604 and the small box pattern become parallel to each other. In other words, as the intermediate condition between FIGS. 22 and 23, if the inner wall of the pellicle frame 2608 is between A and B, that is, within a width Ld of the dicing region, then only one of the two 1st order diffracted light components from the small box mark can be shielded. Thus, this mask can be employed as the focus monitor mask.

More specifically, the distance L from the focus monitor pattern 2605 to the pellicle frame 2608 satisfies:

$$L_{fMIN} < L < L_{fMAX} = L_{fMIN} + Ld \qquad (3)$$

That is, L may be set to fall within the range of $L_{fMIN}$ to $L_d$.

A practical application will be described below. The exposure conditions used here are: exposure wavelength $\lambda$=248 nm, wafer-side numerical aperture NA=0.68, illumination coherence factor $\sigma$=0.75, and the mask pattern magnification was 4. The box-in-box type focus monitor pattern 2605 shown in FIG. 21A was arranged on the end of the dicing region 2602 of the employed exposure mask. The width of the dicing region 2602 was 80 $\mu$m (when converted into a size on the wafer). In the following description, the size is the one converted into a size on the wafer, unless otherwise noted.

The width of the outer box mark was 2 $\mu$m, and the width of the inner box mark was 2 $\mu$m. The inner box mark was formed from 0.3-$\mu$m L/S patterns with a pitch that satisfies equation (2). The height H of the employed pellicle frame 2608 was 6 mm (on the mask). The pellicle frame 2608 was arranged at, as a position that satisfies equation (2), a position at a distance of 1 mm (on the mask) from the focus monitor pattern 2605.

First, the detection sensitivity when actual exposure was performed by using the exposure mask was obtained. A coating type anti-reflection film was formed on an Si wafer to a thickness of 60 nm by spin coating and heating. A chemically amplified positive resist was formed by spin coating to a thickness of 0.4 µm. After that, prebaking was performed at 100° C. for 90 sec. This series of processes was performed in a coater and developer connected to the exposure apparatus. The wafer that had undergone this process was transferred to the exposure apparatus, and was exposed by using the exposure mask.

During exposure, the preset exposure dose of the exposure apparatus was changed between four values, i.e., 17.5 mJ/cm$^2$, 20 mJ/cm$^2$, 22.5 mJ/cm$^2$, and 25 mJ/cm$^2$. Defocus was changed from −0.5 µm to +0.5 µm with a pitch of 0.1 µm. The exposed focus monitor pattern was subjected to the alignment precision measuring apparatus to measure the defocus dependency of the positional shift between the center of the outer box mark and the center of the inner box mark.

Figure 25:
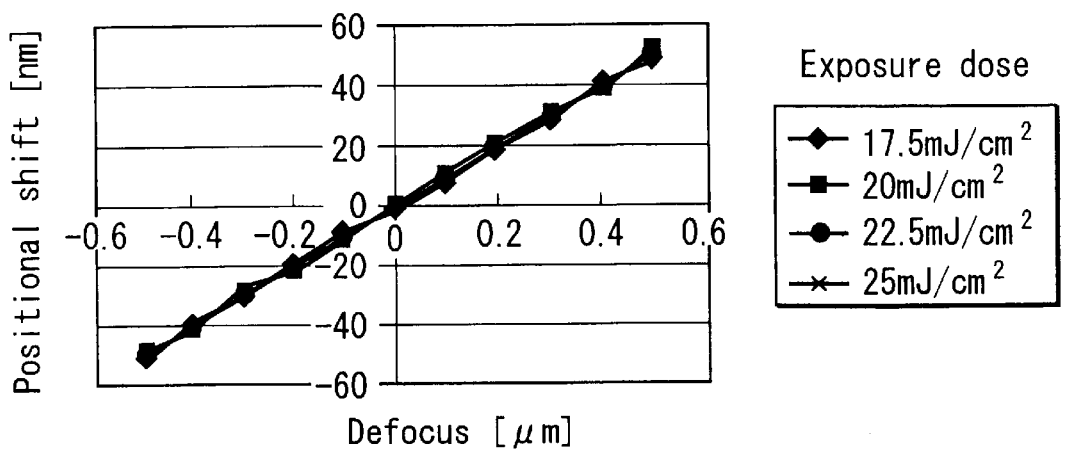
FIG. 25 is a graph showing the relationship between a positional shift among patterns and a defocus in the 11th embodiment.

FIG. 25 shows the relationship between the positional shift and defocus of this case. From FIG. 25, the positional shift does not depend on the exposure dose, and a defocus of 0.1 µm corresponds to a positional shift of 10 nm. The reproducibility of the alignment precision measuring apparatus used in this case is 2.5 nm. When this value was converted into a focus precision, the focus monitor pattern used in this case could realize a high focus detection sensitivity of 25 nm. The influence on the device pattern was also studied. A pattern closest to the focus monitor pattern and a pattern close to the center of the mask were compared. No problem was observed concerning the transfer precision.

As described above, when the pellicle frame was placed at that position which satisfies the above conditions (equations (2) and (3)), the focus precision could be detected as a positional shift of the pattern without adversely affecting the device pattern at all. In an actual measurement, the relative shift between the outer and inner box marks may be measured by using an alignment inspecting apparatus. The defocus, including its direction, could be obtained with high detection sensitivity without using a special mask technique like the conventional one that uses a phase shift mask.

With the exposure mask employed in this case, a box-in-box type focus monitor pattern was used. However, the present invention is not limited to this. It suffices as far as conditions, with which part of a mark detectable by the alignment precision measuring apparatus shields the diffracted light described above, are obtained. Inverted patterns of FIGS. 21A to 21F may also be employed.

Figure 26:
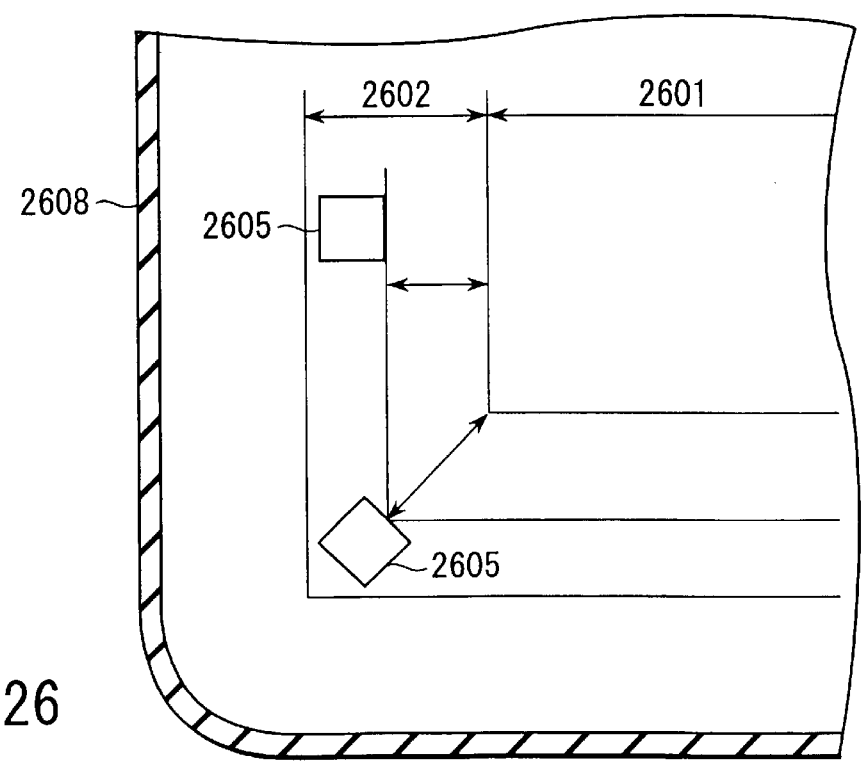
FIG. 26 is a plan view of a modification of the 11th embodiment and shows a case wherein a focus monitor pattern is arranged in a dicing region with a tilt of 45°.

Assume that the dicing region is narrow and it is difficult to arrange the pellicle frame without adversely affecting the device pattern. In this case, as shown in FIG. 26, a focus monitor pattern 2605 may be arranged on the corner of the mask. Then, the distance from a pattern region 2601 to this focus monitor pattern 2605 becomes about 1.4 times. Therefore, the position precision of a pellicle frame 2608 can be moderated.

Figure 27A:
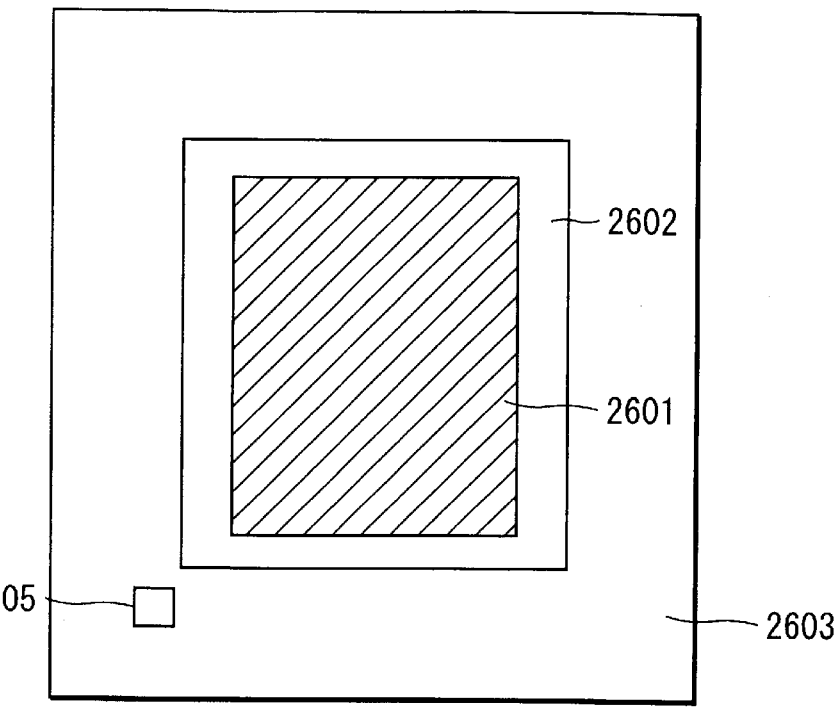
FIG. 27A is a plan view of another modification of the 11th embodiment and shows a case wherein a focus monitor pattern is arranged outside the dicing region.

As shown in FIG. 27A, a focus monitor pattern 2605 may be arranged on a further outside portion of a dicing region 2602, which does not overlap with the device region of the adjacent chip. Exposure may be performed by setting the exposure region to a region including a focus monitor pattern 2605. In this case, since the distance from the device pattern region 2601 to the pellicle frame (not shown; refer to 2608 in FIG. 22) increases, the position precision of the pellicle frame can be moderated effectively.

Figure 27B:
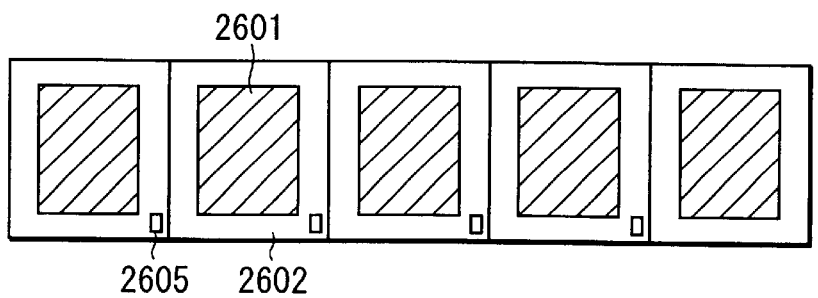
FIG. 27B is a plan view of still another modification of the 11th embodiment and shows a case wherein a focus monitor pattern is arranged outside a dicing region and is arranged on the dicing line of an adjacent chip by step-and-repeat exposure.

FIG. 27B shows a state wherein the mask pattern of FIG. 27A is formed on a wafer in a step-and-repeat manner. In this case, a focus monitor pattern 2605 is exposed onto a dicing region 2602 of an adjacent chip.

Figure 28:
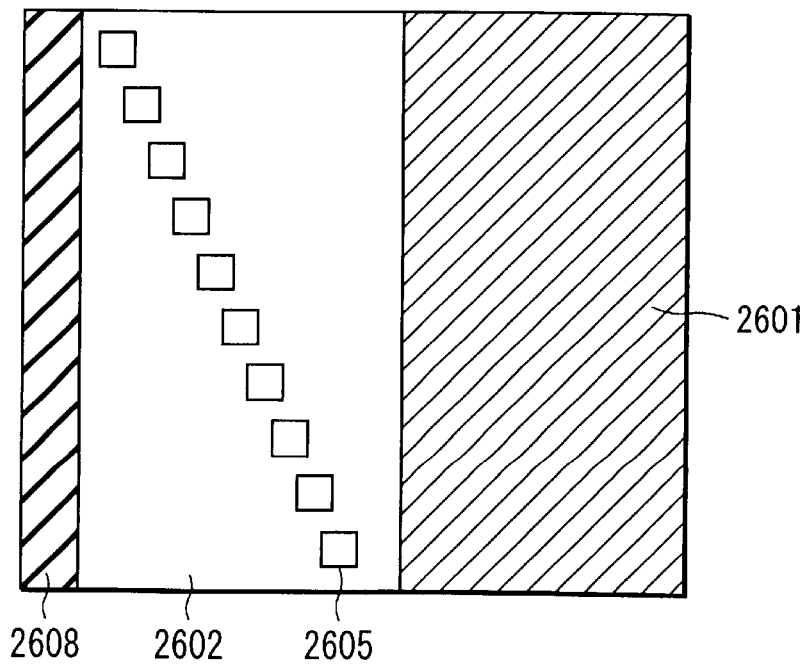
FIG. 28 is a partial plan view of a mask according to still another modification of the 11th embodiment and shows a case wherein focus monitor patterns are arranged in a dicing region while slightly shifting their positions.

In the 11th embodiment, the focus monitor pattern and the device pattern are arranged on one mask. Alternatively, the focus monitor pattern may be arranged on a quality control reticle or the like which is used to control the state of the apparatus. Assume that the relative position precision between the pellicle frame and focus monitor pattern is strict. In this case, as shown in, e.g., FIG. 28, a large number of focus monitor patterns 2605 may be arranged to be slightly displaced from each other. After inspection, as a focus monitor pattern, one focus monitor pattern 2605 that exhibits a desired performance (i.e., one satisfying the relation of equation (3)) may be used.

In this manner, according to the 11th embodiment, to measure the defocus, of the ±1st order light components from the small box mark of the focus monitor pattern, only one is shielded. Thus, the focus precision on the wafer can be measured with high precision as a positional shift. This allows exposure with a constantly appropriate focus, contributing to an increase in yield.

A method of measuring the focus precision has conventionally been available. However, for this purpose, with the conventional method, a special pattern must be used, or a phase shifting film must be used. According to the 11th embodiment, the focus precision can be measured without using such special mask but by using an existing mask with a slight improvement. In measurement, the existing alignment precision measuring apparatus can be used. Hence, no new apparatus need be particularly used for this purpose.

12th Embodiment

Figure 29:
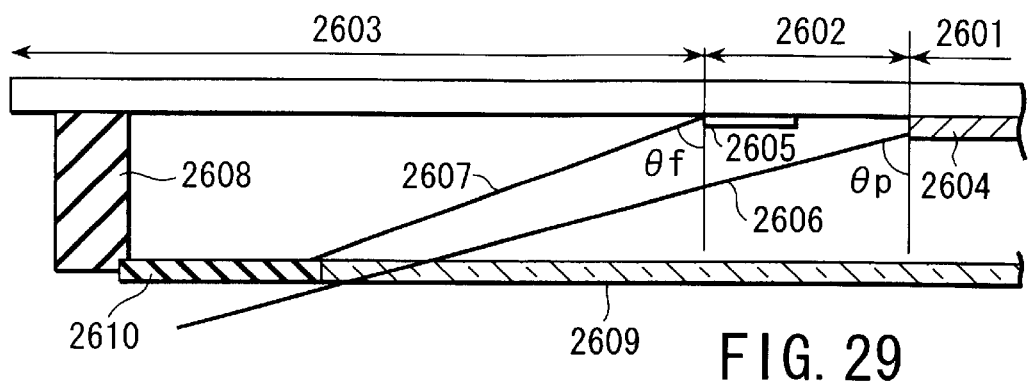
FIG. 29 is a partial sectional view of an exposure mask according to the 12th embodiment and shows a case wherein one component of 1st order diffracted light from a focus monitor pattern is shielded by part of a specially processed pellicle film.

FIG. 29 is a sectional view showing the arrangement of the main part of an exposure mask according to the 12th embodiment. In the following embodiment, portions that are identical to those of FIG. 22 are denoted by the same reference numerals as in FIG. 22, and a repetitive description will be omitted.

In the 11th embodiment, the 1st order diffracted light from the box-in-box pattern is shielded by the pellicle frame 2608. Any means can be used as far as it can shield only one of the two diffracted light components. Regarding this, a pellicle film 2609 for transmitting light originally used for exposure is divided into regions, and the divisional regions are selectively colored. Thus, the pellicle film 2609 is divided into a portion for transmitting light used for exposure and a portion for not transmitting light. Only one of two diffracted light components 2607 from the small box mark is shielded by a colored portion 2610 of the pellicle film 2609. Diffracted light 2606 from a device pattern 2604 is transmitted through the pellicle film 2609.

In this manner, according to the 12th embodiment, some region of the pellicle film 2609 is colored to form the portion 2610 that does not transmit light. Thus, only one of two components of the diffracted light 2607 from the small box mark of a focus monitor pattern 2605 can be shielded. Therefore, the focus precision can be measured in the same manner as in the case of the 11th embodiment. The same effect as that of the 11th embodiment can be obtained.

13th Embodiment

Figure 30:
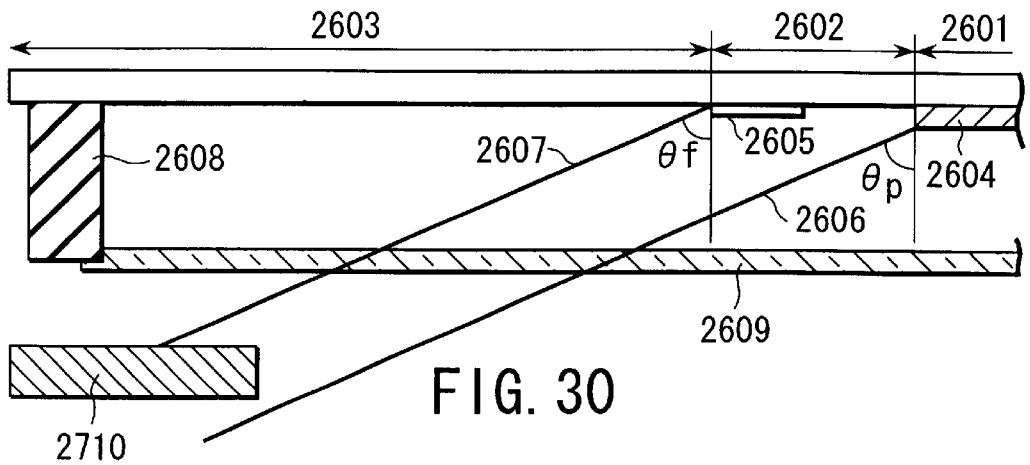
FIG. 30 is a partial sectional view of an exposure mask according to the 13th embodiment and shows a case wherein one component of 1st order diffracted light from a focus monitor pattern is shielded by a light-shielding component attached to an exposure apparatus.

FIG. 30 is a sectional view showing the arrangement of the main part of an exposure mask according to the 13th embodiment. In the 13th embodiment, a light-shielding member 2710 for shielding only one of two 1st order diffracted light components from the box-in-box pattern is arranged at an appropriate position in an exposure apparatus. This is particularly effective when the diffracted light cannot be shielded by a pellicle frame 2608 or pellicle film 2609 due to some limitation posed in mask fabrication.

With the method of the 13th embodiment as well, only one of the two components of 1st order diffracted light 2607 from the small box mark of a focus monitor pattern 2605 can be shielded. Hence, the focus precision can be measured in the same manner as in the 11th embodiment.

14th Embodiment

Figure 31:
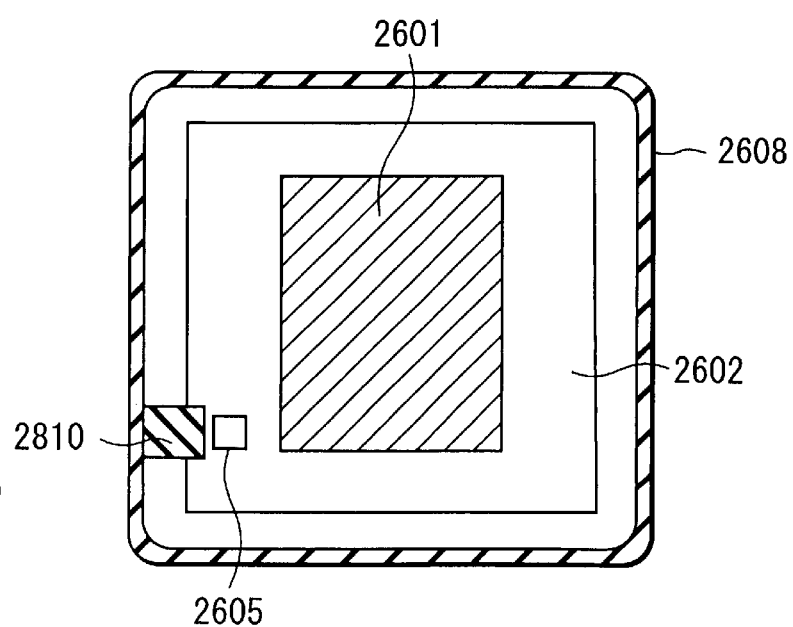
FIG. 31 is a plan view of an exposure mask according to the 14th embodiment and shows a case wherein one component of 1st order diffracted light from a focus monitor pattern is shielded by a light-shielding component attached to the frame.

FIG. 31 is a plan view showing the arrangement of the main part of an exposure apparatus according to the 14th embodiment. A case is assumed wherein, unlike in the 13th embodiment, a pellicle frame 2608 for shielding only diffracted light from a box-in-box pattern cannot be arranged at a predetermined position. More specifically, in this case, an alignment mark on the mask is present near the outer side of the mask substrate. Since the pellicle frame 2608 must surround the pattern on the mask entirely, it must surround not only the pattern region but also the alignment mark on the mask.

In this case, if a focus monitor pattern 2605 of a dicing region 2602 is not present near the reticle alignment mark, a special component 2810 is added to the pellicle frame 2608 to shield one of the two components of 1st order diffracted light 2607 from the small box mark. Thus, even when the pellicle frame 2608 cannot be arranged at a position where it shields one of the two components of the 1st order diffracted light 2607 from the small box mark, only the diffracted light can be shielded by the component 2810. Therefore, with the method of the 14th embodiment, the same effect as that of the 11th embodiment can be obtained.

15th Embodiment

FIG. 32 is a sectional view showing the arrangement of the main part of an exposure mask according to the 15th embodiment. In contrast to the cases of the 13th and 14th embodiments, when a pellicle frame 2608 is too close to a pattern region 2601, two diffracted light components 2606 and 2607 respectively from a device pattern 2604 and focus monitor pattern 2605 may be shielded by the pellicle frame 2608. In this case, a hole may be formed in that portion of the pellicle frame 2608 which shields the diffracted light from the device pattern 2604, to transmit this diffracted light. Naturally, the 1st order diffracted light 2607 from the small box mark of the focus monitor pattern 2605 must be limited to such a height that it can be shielded.

With the 15th embodiment as well, only one of the two components of the 1st order diffracted light 2607 from the small box mark of the focus monitor pattern 2605 can be shielded. The diffracted light from the device pattern 2604 can be transmitted. Thus, the same effect as that of the 11th embodiment can be obtained.

16th Embodiment

FIG. 33B is a sectional view showing the arrangement of the main part of an exposure mask according to the 16th embodiment. In the 11th embodiment, the focus monitor pattern is arranged at the endmost portion of the dicing region, and various types of conditions are obtained. However, the present invention is not limited to this. As shown in FIG. 33A, a value which is simply set to Ld in the 11th embodiment may be replaced with Le=Ld−x/2−y where Ld is the length of the dicing region itself, $\underline{x}$ is one side of the small box mark of a focus monitor pattern 2605, and $\underline{y}$ is the distance from the center of the focus monitor pattern 2605 to the end of a dicing region 2602. Then, the focus precision can be measured by this mask with the same conditions as those of the 11th embodiment.

In FIG. 22, in order to facilitate understanding, the diffracted light from the focus monitor pattern 2605 starts from the right end of the pattern 2605. Strictly, the start point of the diffracted light differs depending on the arrangement of the monitor pattern. In the 16th embodiment, the small box mark is formed from fine patterns, and the large box mark is formed from coarse patterns. The diffraction angle from a fine pattern is larger than that from a coarse pattern. Thus, in FIG. 33B, diffracted light from fine patterns is drawn. In FIG. 33B, all diffracted light components emerging leftward from the fine patterns must be shielded by a pellicle frame 2608. Thus, the right end of the small box mark is set as the start point of the diffracted light. L defined by the above equation (3) must be determined considering this.

In the 11th to 16th embodiments, as a focus monitor pattern, the box-in-box patterns as shown in FIGS. 21A to 21F are used. The focus precision is measured from the relative distance between the inner and outer patterns. However, the patterns to be employed are not limited to them. Any pattern can be used as far as it can shield only one of the two components of 1st order diffracted light.

For example, assume a pattern in which the pattern pitch is increased and the diffraction angle is decreased so both of the two 1st order diffracted light components reach the wafer. With this pattern, even if defocus occurs, a positional shift does not occur. When such a pattern is arranged close to the focus monitor pattern, the focus precision can be measured from the relative distance between this pattern and the focus monitor pattern.

Regarding measurement, an alignment inspecting apparatus need not always be used. Any measuring apparatus may be used as far as it can measure a relative shift between a pattern, for which only one of the two 1st order diffracted light components is shielded and a transfer position on the wafer is shifted due to defocus, and a pattern, for which the diffracted light is not shielded at all, that is, which is not positionally shifted due to focus.

As has been described above in detail, according to the 11th to 16th embodiments, a focus monitor pattern may be formed from two types of patterns with different diffraction angles. One of the two, positive and negative, diffracted light components from the pattern with the larger diffraction angle may be shielded. Thus, defocus can be detected from the shifts of the two types of patterns.

In this case, the focus monitor pattern need not be specially formed on a monitor mask. If a focus monitor pattern is arranged outside a pattern region where a device pattern is formed, it can be used for focus monitoring. Therefore, the focus of the projection optics can be measured with high sensitivity and high precision without using a special mask for focus monitoring.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A focus monitoring method of transferring a focus monitor pattern on a mask illuminated with an electromagnetic wave or electron beam onto an exposure target substrate by projection optics, and measuring a shift of the pattern on the substrate, thereby monitoring an effective focus, comprising:

preparing the mask on which the focus monitor pattern comprising at least two types of pattern groups is formed;

illuminating a pattern group A of the at least two pattern groups with illumination light while a barycenter of an illumination light source of illumination optics is in an off-axis state;

illuminating at least a pattern group B of the at least two pattern groups with illumination light while the barycenter of the illumination light source is in an on-axis state; and measuring a positional deviation between the pattern group A and the pattern group B transferred onto the substrate.

2. The method according to claim 1, wherein said preparing the mask includes arranging the pattern group A at an arbitrary portion on a dicing region surrounding a semiconductor device pattern region on the mask, arranging the pattern group B at another position in the dicing region to substantially oppose, through the semiconductor device pattern region, a position where the pattern group A is arranged, and arranging the pattern group B to be separate from the pattern group A by a distance substantially corresponding to a stepping amount with which a stage mounted with the substrate is sequentially stepped to transfer the mask onto the substrate by the projection optics, said illuminating the pattern group A with the illumination light while the barycenter of the illumination light source is in an off-axis state and illuminating the pattern group B with the illumination light while the barycenter of the illumination light source is in an on-axis state includes sequentially stepping the stage mounted with the substrate, thereby transferring the mask onto the substrate by the projection optics, and said measuring the relative positional deviation between the pattern group A and the pattern group B includes measuring the positional deviation between the pattern group A which is transferred onto the substrate after N-time (N is a positive integer) stepping, and the pattern group B which is transferred onto the substrate after (N+1)-time stepping.

3. The method according to claim 1, wherein said preparing the mask on which the focus monitor pattern is formed comprises arranging the pattern group A and a pattern group C of at least four types of pattern groups, which comprise the focus monitor pattern comprising the at least four types of pattern groups, to be close to an arbitrary portion in a dicing region surrounding a semiconductor device pattern region on the mask, arranging the pattern group B and a pattern group D of the at least four types of pattern groups at another position in the dicing region to substantially oppose, through the semiconductor device pattern region, a position where the pattern group A and the pattern group C are arranged, and arranging the pattern group B and the pattern group D to be separate from the pattern group A and the pattern group C by a distance substantially corresponding to a stepping amount with which a stage mounted with the substrate is sequentially stepped to transfer the mask onto the substrate by the projection optics, said illuminating at least the pattern group B with the illumination light while the barycenter of the illumination light source is in an on-axis state includes illuminating the pattern group B, C, and D with the illumination light while the barycenter of the illumination light source is in an on-axis state, said illuminating the pattern group A with the illumination light while the barycenter of the illumination light source is in an off-axis state and illuminating at least the pattern group B with the illumination light while the barycenter of the illumination light is in an on-axis state includes sequentially stepping the stage mounted with the substrate, thereby transferring the mask onto the substrate by the projection optics, and said measuring the positional deviation between the pattern group A and the pattern group B includes measuring a first positional shift a between the pattern group A which is transferred onto the substrate after N-time (N is a positive integer) stepping and the pattern group B which is transferred onto the substrate after (N+1)-time stepping, measuring a second positional shift β between the pattern group C which is transferred onto the substrate after N-time stepping and the pattern group D which is transferred onto the substrate after (N+1)-time stepping, and subtracting β from α, thereby calculating the positional deviation.

4. The method according to claim 3, wherein a combination of the pattern group A and the pattern group B and a combination of the pattern group C and the pattern group D are each a combination of a first and a second pattern group in a box-in-box pattern in which the first pattern group is surrounded by the second pattern group.

5. The method according to claim 3, wherein a combination of the pattern group A and the pattern group B and a combination of the pattern group C and the pattern group D are each a combination of line patterns with the same width.

6. The method according to claim 3, wherein said calculating the positional deviation by subtracting β from α includes measuring, as the first positional shift α, a size of a pattern on the substrate formed by double exposure of the pattern group A which is transferred onto the substrate after N-time stepping and the pattern group B which is transferred onto the substrate after (N+1)-time stepping, measuring, as the second positional shift β, a size of a pattern on the substrate formed by double exposure of the pattern group C which is transferred onto the substrate after N-time stepping and the pattern group D which is transferred onto the substrate after (N+1)-time stepping, and subtracting β from α, thereby calculating the positional deviation.

7. The method according to claim 3, wherein said calculating the positional deviation by subtracting β from α includes measuring, as the first positional shift α, a distance between the pattern group A which is transferred onto the substrate after N-time stepping and the pattern group B which is transferred onto the substrate after (N+1)-time stepping, measuring, as the second positional shift β, a distance between the pattern group C which is transferred onto the substrate after N-time stepping and the pattern group D which is transferred onto the substrate after (N+1)-time stepping, and subtracting β from α, thereby calculating the positional deviation.

8. The method according to claim 1, wherein said illuminating the pattern group A with the illumination light while the barycenter of the illumination light source is in an off-axis state includes arranging a light-shielding body between one region of the mask corresponding to the pattern group and the illumination light source, and shielding part of the illumination light that illuminates the pattern group A.

9. The method according to claim 1, wherein said illuminating the pattern A with the illumination light while the barycenter of the illumination light source is in an off-axis state includes arranging an optical element configured to deflect an optical path in one direction on that surface of one region of the mask corresponding to the pattern group A, which opposes the illumination light source, or in a vicinity thereof.

10. The method according to claim 9, wherein a wedge type transmitting member or a diffraction grating is used as the optical element that deflects the optical path in one direction.

11. The method according to claim 1, further comprising illuminating the pattern group A with illumination light while a barycenter of an illumination light source is in an off-axis state, arranging a light-shielding body at a position optically conjugate to that surface of one region of the mask corresponding to the pattern group A, which opposes the illumination light source, or in a vicinity thereof, and shielding part of the illumination light that illuminates the pattern group A.

12. The method according to claim 11, wherein the optically conjugate position is a position of a reticle blind in the illumination optics.

13. The method according to claim 1, wherein said illuminating the pattern group A with the illumination light while the barycenter of the illumination light source is in an off-axis state includes arranging an optical element configured to deflect an optical path in one direction at a position optically conjugate to that surface of one region of the mask corresponding to the pattern group A, which opposes the illumination light source, or in a vicinity thereof.

14. The method according to claim 13, wherein a wedge type transmitting member or a diffraction grating is used as the optical element that deflects the optical path in one direction.

15. The method according to claim 13, wherein the optically conjugate position is a position of a reticle blind in the illumination optics.

16. An exposure apparatus which transfers a first and a second pattern on a focus monitor mask illuminated with an electromagnetic wave or electron beam onto an exposure target substrate by projection optics, and measures the first and the second pattern on the substrate, thereby monitoring an effective focus, comprising:
   illumination optics configured to illuminate the first pattern while a barycenter of an illumination light source is in an on-axis state, and
   a component interposed in the illumination optics and configured to be able to illuminate the second pattern while the barycenter thereof is in an off-axis state.

17. The exposure apparatus according to claim 16, wherein the component includes a light-shielding body interposed between the second pattern and the illumination light source and arranged at a position optically conjugate to a surface where the second pattern is formed, or in a vicinity thereof.

18. The exposure apparatus according to claim 17, wherein the optically conjugate position is a position of a reticle blind in the illumination optics.

19. The exposure apparatus according to claim 16, wherein the component includes an optical element, interposed between the second pattern and the illumination light source and arranged at a position optically conjugate to a surface where the second pattern is formed, or in a vicinity thereof, to deflect an optical path in one direction.

20. The exposure apparatus according to claim 19, wherein the optically conjugate position is a position of a reticle blind in the illumination optics.

21. The exposure apparatus according to claim 19, wherein the optical element to deflect the optical path in one direction is a wedge type transmitting member or a diffraction grating.

22. An exposure mask comprising:
   a transparent substrate with a first and a second major surface, the second major surface opposing an illumination light source;
   a first and a second pattern configured to focus-monitor and formed on the first major surface; and
   a component which is arranged on or in the transparent substrate so as to shield the second pattern with respect to the illumination light source and which sets a barycenter of the illumination light source in an off-axis state.

23. The mask according to claim 22, wherein the component configured to set the barycenter of the illumination light source in an off-axis state comprises a light-shielding body.

24. The mask according to claim 22, wherein the component configured to set the barycenter of the illumination light source in an off-axis state comprises an optical element configured to deflect an optical path in one direction.

25. The mask according to claim 24, wherein the optical element configured to deflect the optical path in one direction is a wedge type transmitting member or a diffraction grating.

26. An exposure mask which transfers a device pattern onto a wafer through projection optics, comprising:
   a transparent substrate with a major surface;
   the device pattern formed in a pattern region on the major surface of the transparent substrate;
   a focus monitor pattern arranged in a region outside the pattern region on the major surface of the transparent substrate and formed from two types of patterns with different diffraction angles; and
   a shielding portion which shields one of positive and negative diffracted light components in two opposing directions which pass through a pupil of the projection optics and are diffracted by one pattern of the focus monitor pattern which has a larger diffraction angle.

27. The mask according to claim 26, wherein the focus monitor pattern comprises a first pattern group and a second pattern group which substantially surrounds the first pattern group, and the first and the second pattern group have a different line width with respect to each other.

28. The mask according to claim 26, wherein the light-shielding portion is positioned to pass, of diffracted light from the device pattern, a light beam passing through the pupil of the projection optics.

29. The mask according to claim 26, wherein the light-shielding portion shields one of positive and negative 1st order diffracted light components from that pattern of the focus monitor pattern which has the larger diffraction angle.

30. The mask according to claim 26, wherein the focus monitor pattern comprises a plurality of focus monitor patterns formed at different distances from the pattern region.

31. The mask according to claim 26, further comprising a pellicle frame configured to surround the pattern region to protect one major surface of said transparent substrate, and a protection member made of a pellicle film configured to seal one end opening of the pellicle frame, the pellicle frame serving to shield at least one of the diffracted light components.

32. The mask according to claim 31, wherein a pitch p of that pattern of the focus monitor pattern which has the larger diffraction angle satisfies a relationship:

$$\tan^{-1}(L/H) < \cos^{-1}(\lambda/p) < \sin^{-1}(NA/n)$$

where L is a distance from the pattern to the pellicle frame, H is a height of the pellicle frame, λ is a wavelength of exposure light of the projection optics, NA is a wafer side numerical aperture, and n is a magnification.

33. The mask according to claim 26, further comprising
a pellicle frame configured to surround the pattern region in order to protect one major surface of the transparent substrate, and a protection member made of a pellicle film configured to seal one end opening of the pellicle frame, wherein
a light-shielding body configured to shield one of the diffracted light components is provided to part of the pellicle film.

34. The mask according to claim 33, wherein a pitch p of that pattern of the focus monitor pattern which has the larger diffraction angle satisfies a relationship:

$$\tan^{-1}(L'/H) < \cos^{-1}(\lambda/p) < \sin^{-1}(NA/n)$$

where L' is a distance from the pattern to the light-shielding body adhering to the pellicle film, H is a height of the pellicle frame, λ is a wavelength of exposure light of the projection optics, NA is a wafer side numerical aperture, and n is a magnification.

35. A focus monitoring method comprising:
transferring the device pattern and the focus monitor pattern onto a wafer by using the exposure mask according to claim 26;
measuring a positional shift produced between the first and the second pattern group of the focus monitor pattern transferred onto the wafer; and
detecting the positional shift as a defocus.

36. A focus monitoring method employed in transferring a device pattern onto a wafer through projection optics by using an exposure mask in which a device pattern is formed in a pattern region on one major surface of a transparent substrate, comprising:
arranging, in a region outside the pattern region on one major surface of the transparent substrate, a focus monitor pattern formed from two types of patterns with different diffraction angles;
when transferring the device pattern onto a sample, shielding one of positive and negative diffracted light components which pass through a pupil of the projection optics and are diffracted by one pattern of the focus monitor pattern which has a larger diffraction angle;
causing a positional shift between the two types of patterns of the focus monitor pattern on the sample; and
detecting the positional shift as a defocus.

37. The method according to claim 36, wherein a box-in-box pattern in which inner and outer patterns have different diffraction angles is used as the focus monitor pattern.

38. The method according to claim 36, wherein said shielding the diffracted light includes passing, of the diffracted light from the device pattern, a light beam which passes through the pupil of the projection optics.

39. The method according to claim 36, wherein said shielding the diffracted light includes shielding the diffracted light with a light-shielding body arranged between the exposure mask and the sample after the diffracted light passes through the exposure mask and reaches the sample.

40. The method according to claim 36, wherein said shielding the diffracted light includes using a pellicle frame arranged on the exposure mask.

41. The method according to claim 40, wherein a pitch p of that pattern of the focus monitor pattern which has the larger diffraction angle satisfies a relationship:

$$\tan^{-1}(L/H) < \cos^{-1}(\lambda/p) < \sin^{-1}(NA/n)$$

where L is a distance from the pattern to the pellicle frame, H is a height of the pellicle frame, λ is a wavelength of exposure light of the projection optics, NA is a wafer side numerical aperture, and n is a magnification.

42. The method according to claim 36, wherein said shielding the diffracted light includes causing a light-shielding body to adhere to part of a pellicle film arranged on the mask.

43. The method according to claim 42, wherein a pitch p of that pattern of the focus monitor pattern which has the larger diffraction angle satisfies a relationship:

$$\tan^{-1}(L'/H) < \cos^{-1}(\lambda/p) < \sin^{-1}(NA/n)$$

where L' is a distance from the pattern to the light-shielding body adhering to said pellicle film, H is a height of the pellicle frame, λ is a wavelength of exposure light of the projection optics, NA is a wafer side numerical aperture, and n is a magnification.

* * * * *

UNITED STATES PATENT AND TRADEMARK OFFICE
CERTIFICATE OF CORRECTION

PATENT NO. : 6,701,512 B2
DATED : March 2, 2004
INVENTOR(S) : Sutani et al.

It is certified that error appears in the above-identified patent and that said Letters Patent is hereby corrected as shown below:

<u>Column 22,</u>
Line 17, change "shift a" to -- shift α --.

Signed and Sealed this

Fifteenth Day of June, 2004

JON W. DUDAS
*Acting Director of the United States Patent and Trademark Office*